United States Patent
Seino et al.

(10) Patent No.: US 12,463,031 B2
(45) Date of Patent: Nov. 4, 2025

(54) METHOD OF PROCESSING SUBSTRATE, RECORDING MEDIUM, AND SUBSTRATE PROCESSING APPARATUS

(71) Applicant: Kokusai Electric Corporation, Tokyo (JP)

(72) Inventors: Atsuro Seino, Toyama (JP); Arito Ogawa, Toyama (JP); Yutaka Matsuno, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 893 days.

(21) Appl. No.: 17/535,778

(22) Filed: Nov. 26, 2021

(65) Prior Publication Data
US 2022/0165565 A1    May 26, 2022

(30) Foreign Application Priority Data
Nov. 25, 2020 (JP) ................. 2020-194947

(51) Int. Cl.
*H01L 21/02* (2006.01)
*C23C 16/455* (2006.01)
*C23C 16/458* (2006.01)
*C23C 16/46* (2006.01)

(52) U.S. Cl.
CPC .. *H01L 21/02263* (2013.01); *C23C 16/45563* (2013.01); *C23C 16/4584* (2013.01); *C23C 16/46* (2013.01)

(58) Field of Classification Search
CPC ......... H01L 21/02263; H01L 21/32051; H01L 21/67103; H01L 21/28568; C23C 16/45563; C23C 16/4584; C23C 16/46; C23C 16/0272; H10B 99/00; H10B 12/488
See application file for complete search history.

(56) References Cited

U.S. PATENT DOCUMENTS

| | | | |
|---|---|---|---|
| 5,981,388 A | 11/1999 | Miyamoto | |
| 6,551,929 B1 * | 4/2003 | Kori | H01L 21/76876 438/654 |

(Continued)

FOREIGN PATENT DOCUMENTS

| | | |
|---|---|---|
| JP | 09-205070 A | 8/1997 |
| JP | 2004-186693 A | 7/2004 |

(Continued)

OTHER PUBLICATIONS

Taiwan Office Action issued on Aug. 3, 2022 for Taiwan Patent Application No. 110142864.

(Continued)

*Primary Examiner* — Latanya N Crawford Eason
(74) *Attorney, Agent, or Firm* — Volpe Koenig

(57) ABSTRACT

There is provided a technique that includes: (a) supplying a first gas containing hydrogen and oxygen to a substrate in a process chamber; (b) supplying a second gas containing nitrogen and hydrogen to the substrate; (c) supplying a third gas containing a halogen element to the substrate; (d) supplying a reaction gas to the substrate; (e) performing (a) and (b); and (f) forming a film on the substrate by performing (c) and (d) after performing (e).

16 Claims, 18 Drawing Sheets

(56) References Cited

U.S. PATENT DOCUMENTS

| | | | |
|---|---|---|---|
| 2003/0027431 A1* | 2/2003 | Sneh | C23C 16/45536 |
| | | | 438/758 |
| 2003/0049942 A1* | 3/2003 | Haukka | H01L 29/518 |
| | | | 257/E21.228 |
| 2004/0106261 A1 | 6/2004 | Huotari et al. | |
| 2009/0104352 A1 | 4/2009 | Hasegawa | |
| 2012/0202357 A1 | 8/2012 | Sato et al. | |
| 2017/0117133 A1* | 4/2017 | Yamamoto | H01L 21/02211 |
| 2018/0037989 A1 | 2/2018 | Kaneko et al. | |
| 2018/0204732 A1* | 7/2018 | Kamakura | H01L 23/532 |
| 2019/0304791 A1 | 10/2019 | Degai | |
| 2020/0119426 A1 | 4/2020 | Peng et al. | |

FOREIGN PATENT DOCUMENTS

| | | |
|---|---|---|
| JP | 2006-332139 A | 12/2006 |
| JP | 2011-066263 A | 3/2011 |
| JP | 2013-145796 A | 7/2013 |
| JP | 2014-506013 A | 3/2014 |
| JP | 2019-175911 A | 10/2019 |
| KR | 10-2014-0050581 A | 4/2014 |
| KR | 10-2018-0016304 A | 2/2018 |
| TW | 201234425 A | 8/2012 |
| WO | 2019/058608 A1 | 3/2019 |

OTHER PUBLICATIONS

Korean Office Action issued on Nov. 20, 2023 for Korean Patent Application No. 10-2021-0164505.

Japanese Office Action issued on Sep. 13, 2022 for Japanese Patent Application No. 2020-194947.

Singapore Written Opinion issued on Feb. 14, 2024 for Singapore Patent Application No. 10202113140V.

Japanese Office Action issued on Feb. 21, 2023 for Japanese Patent Application No. 2020-194947.

Taiwan Office Action issued on Mar. 2, 2023 for Taiwan Patent Application No. 110142864.

Singapore Search Report issued on Mar. 6, 2023 for Singapore Patent Application No. 10202113140V.

Singapore Written Opinion issued on Mar. 6, 2023 for Singapore Patent Application No. 10202113140V.

* cited by examiner

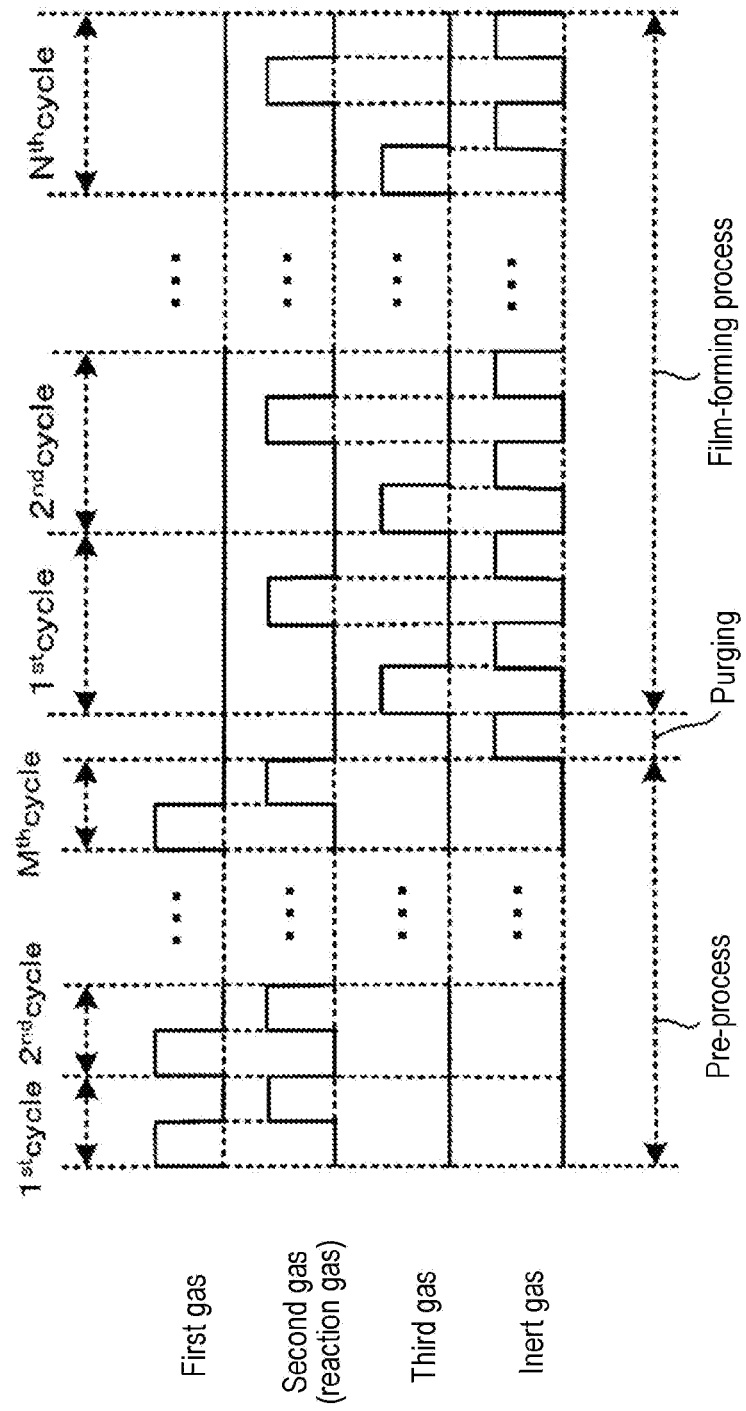

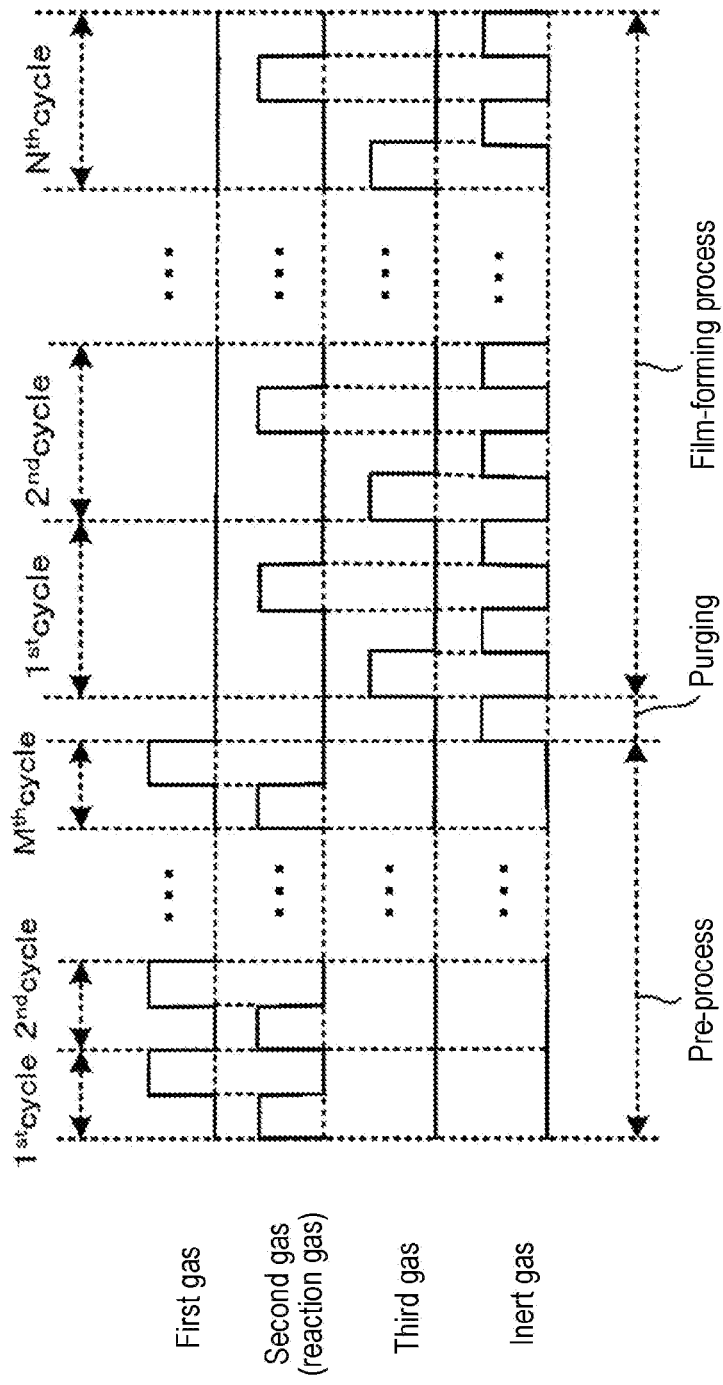

METHOD OF PROCESSING SUBSTRATE, RECORDING MEDIUM, AND SUBSTRATE PROCESSING APPARATUS

CROSS-REFERENCE TO RELATED APPLICATION

This application is based upon and claims the benefit of priority from Japanese Patent Application No. 2020-194947, filed on Nov. 25, 2020, the entire contents of which are incorporated herein by reference.

TECHNICAL FIELD

The present disclosure relates to a method of processing a substrate, a recording medium, and a substrate processing apparatus.

BACKGROUND

In the related art, for example, a low-resistance tungsten (W) film is used as a word line of a NAND flash memory or a DRAM including a three-dimensional structure. Further, for example, a titanium nitride (TiN) film may be used as a barrier film between the W film and an insulating film.

However, when the TiN film is formed, a thin film may not easily form a continuous film and may grow in an island shape, which may result in a low coverage.

SUMMARY

Some embodiments of the present disclosure provide a technique capable of improving a coverage.

According to some embodiments of the present disclosure, there is provided a technique that includes: (a) supplying a first gas containing hydrogen and oxygen to a substrate in a process chamber; (b) supplying a second gas containing nitrogen and hydrogen to the substrate; (c) supplying a third gas containing a halogen element to the substrate; (d) supplying a reaction gas to the substrate; (e) performing (a) and (b); and (f) forming a film on the substrate by performing (c) and (d) after performing (e).

BRIEF DESCRIPTION OF DRAWINGS

FIG. 6 is a diagram showing a modification of a substrate processing sequence according to embodiments of the present disclosure.

FIG. 11 is a diagram showing a modification of a substrate processing sequence according to embodiments of the present disclosure.

DETAILED DESCRIPTION

Figure 1:
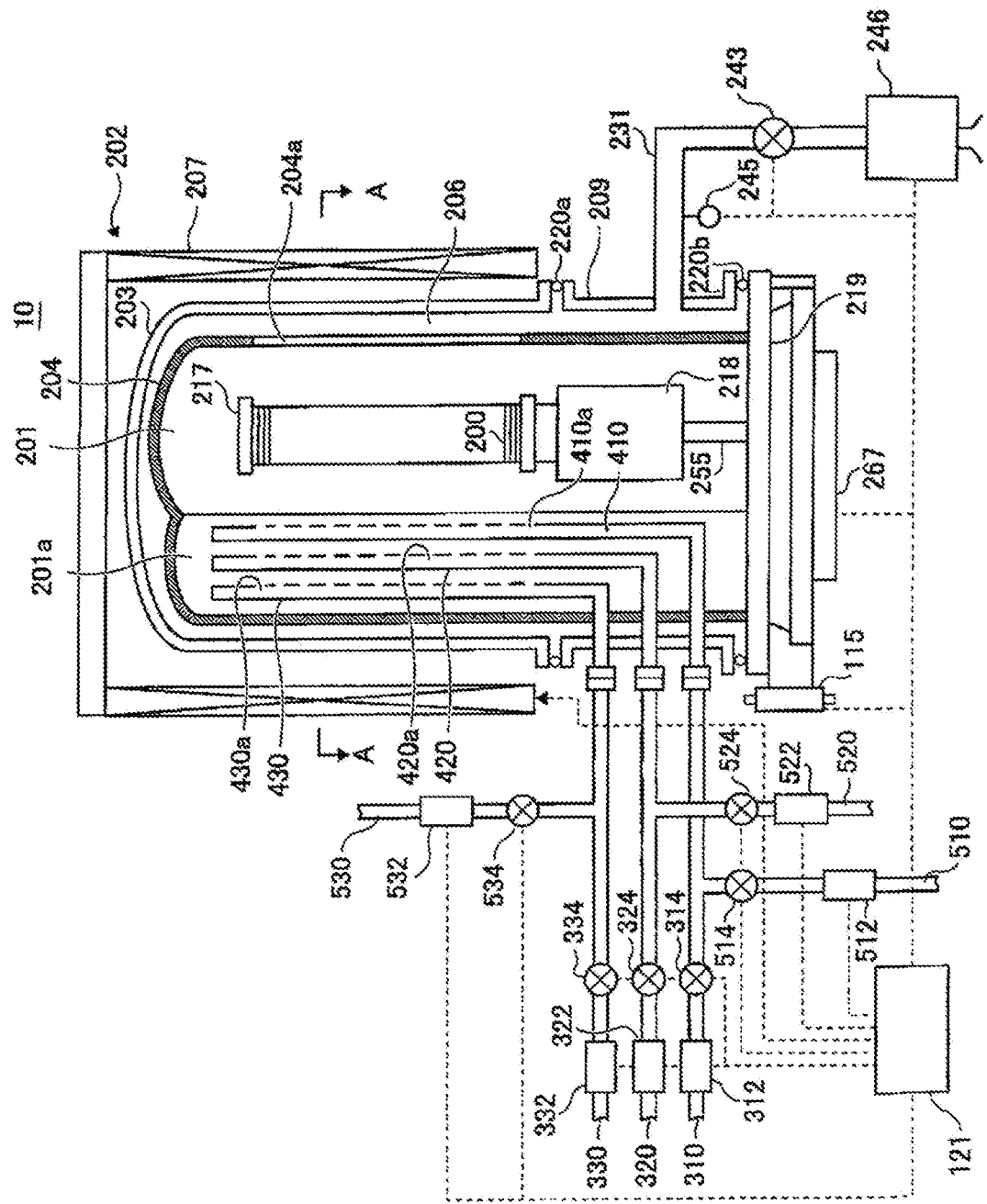
FIG. 1 is a longitudinal sectional view schematically showing a vertical process furnace of a substrate processing apparatus according to embodiments of the present disclosure.

Embodiments of the present disclosure will now be described with reference to FIGS. 1 to 5D. The drawings used in the following description are schematic, and a dimensional relationship, ratios, and the like of various elements shown in figures may not match the actual ones. Further, a dimensional relationship, ratios, and the like of various elements among plural figures may not match each other.

(1) Configuration of Substrate Processing Apparatus

A substrate process apparatus 10 includes a process furnace 202 in which a heater 207 as a heating means (a heating mechanism or a heating system) is provided. The heater 207 is formed in a cylindrical shape and is supported by a heater base (not shown) as a support plate to be vertically installed.

An outer tube 203 forming a process container is disposed inside the heater 207 to be concentric with the heater 207. The outer tube 203 is made of, for example, a heat resistant material such as quartz ($SiO_2$) or silicon carbide (SiC) and is formed in a cylindrical shape with its upper end closed and its lower end opened. A manifold (inlet flange) 209 is disposed below the outer tube 203 to be concentric with the outer tube 203. The manifold 209 is made of, for example, a metal material such as stainless steel (SUS) and is formed in a cylindrical shape with its upper and lower ends opened. An O-ring 220a serving as a seal is installed between the upper end portion of the manifold 209 and the outer tube 203. When the manifold 209 is supported by the heater base, the outer tube 203 is installed vertically.

An inner tube 204 forming the process container is disposed inside the outer tube 203. The inner tube 204 is made of, for example, a heat resistant material such as quartz ($SiO_2$) or silicon carbide (SiC) and is formed in a cylindrical shape with its upper end closed and its lower end opened. The process container mainly includes the outer tube 203, the inner tube 204, and the manifold 209. A process chamber 201 is formed in a hollow cylindrical portion (inside the inner tube 204) of the process container.

The process chamber 201 is configured to be capable of accommodating wafers 200 as substrates in such a state that the wafers 200 are arranged in a horizontal posture and in multiple stages along a vertical direction by a boat 217 which will be described later.

Nozzles 410, 420, and 430 are installed in the process chamber 201 to penetrate a sidewall of the manifold 209 and the inner tube 204. Gas supply pipes 310, 320, and 330 are connected to the nozzles 410, 420, and 430, respectively. However, the process furnace 202 in the embodiments is not limited to the above-described shape.

Mass flow controllers (MFCs) 312, 322, and 332, which are flow rate controllers (flow rate control parts), are installed at the gas supply pipes 310, 320, and 330, respectively, sequentially from the corresponding upstream sides. Further, valves 314, 324, and 334, which are opening/closing valves, are installed at the gas supply pipes 310, 320, and 330, respectively. Gas supply pipes 510, 520, and 530 configured to supply an inert gas are connected to the gas supply pipes 310, 320, and 330 at the downstream side of the valves 314, 324, and 334, respectively. MFCs 512, 522, and 532, which are flow rate controllers (flow rate control parts), and valves 514, 524, and 534, which are opening/closing valves, are installed at the gas supply pipes 510, 520, and 530, respectively, sequentially from the corresponding upstream sides.

The nozzles 410, 420, and 430 are connected to leading ends of the gas supply pipes 310, 320, and 330, respectively. The nozzles 410, 420, and 430 are configured as L-shaped nozzles, and their horizontal portions are installed to penetrate the sidewall of the manifold 209 and the inner tube 204. Vertical portions of the nozzles 410, 420, and 430 are installed inside a channel-shaped (groove-shaped) preliminary chamber 201a formed to protrude outward in a radial direction and extend in a vertical direction of the inner tube 204 and are also installed in the preliminary chamber 201a toward an upper side (an upper side in an arrangement direction of the wafers 200) along the inner wall of the inner tube 204.

The nozzles 410, 420, and 430 are installed to extend from a lower region to an upper region of the process chamber 201, and a plurality of gas supply holes 410a, 420a, and 430a are formed at positions facing the wafers 200, respectively. Thus, a process gas is supplied from the gas supply holes 410a, 420a, and 430a of the nozzles 410, 420, and 430 to the wafers 200 respectively. The gas supply holes 410a, 420a, and 430a are formed from a lower portion to an upper portion of the inner tube 204, are the same in an aperture area, and are installed at the same aperture pitch. However, the gas supply holes 410a, 420a, and 430a are not limited to the above-described shape. For example, the aperture area may be gradually increased from the lower portion to the upper portion of the inner tube 204. Thus, the flow rate of the gas supplied from the gas supply holes 410a, 420a, and 430a may be more uniform.

The gas supply holes 410a, 420a, and 430a of the nozzles 410, 420, and 430 are formed at height positions from a lower portion to an upper portion of the boat 217, which will be described later. Therefore, the process gas supplied into the process chamber 201 from the gas supply holes 410a, 420a, and 430a of the nozzles 410, 420, and 430 is supplied to the entire region of the wafers 200 accommodated from the lower portion to the upper portion of the boat 217. The nozzles 410, 420, and 430 are installed to extend from the lower region to the upper region of the process chamber 201, but may be installed to extend to the vicinity of a ceiling of the boat 217 in some embodiments.

As the process gas, a first gas containing hydrogen (H) and oxygen (O) is supplied from the gas supply pipe 310 into the process chamber 201 via the MFC 312, the valve 314, and the nozzle 410.

As the process gas, a second gas containing nitrogen (N) and H is supplied from the gas supply pipe 320 into the process chamber 201 via the MFC 322, the valve 324, and the nozzle 420. In the present disclosure, the second gas is also used as a reaction gas that reacts with a third gas to be described later. The second gas may also be referred to as a reducing gas.

As the process gas, the third gas containing a halogen element is supplied from the gas supply pipe 330 into the process chamber 201 via the MFC 332, the valve 334, and the nozzle 430.

As an inert gas, for example, a $N_2$ gas is supplied from the gas supply pipes 510, 520, and 530 into the process chamber 201 via the MFCs 512, 522, and 532, the valves 514, 524, and 534, and the nozzles 410, 420, and 430, respectively. Hereinafter, an example in which the $N_2$ gas is used as the inert gas will be described. However, as the inert gas, in addition to the $N_2$ gas, it may be possible to use, e.g., a rare gas such as an argon (Ar) gas, a helium (He) gas, a neon (Ne) gas, a xenon (Xe) gas, or the like.

A process gas supply system mainly includes the gas supply pipes 310, 320, and 330, the MFCs 312, 322, and 332, the valves 314, 324, and 334, and the nozzles 410, 420, and 430. However, the nozzles 410, 420, and 430 may be considered as the process gas supply system. The process gas supply system may be referred to as a gas supply system. When the first gas is flowed from the gas supply pipe 310, a first gas supply system mainly includes the gas supply pipe 310, the MFC 312, and the valve 314. However, the first gas supply system may include the nozzle 410. Further, when the second gas flows from the gas supply pipe 320, a second gas supply system mainly includes the gas supply pipe 320, the MFC 322, and the valve 324. However, the second gas supply system may include the nozzle 420. Further, when a third gas flows from the gas supply pipe 330, a third gas supply system mainly includes the gas supply pipe 330, the MFC 332, and the valve 334. However, the third gas supply system may include the nozzle 430. When the second gas as the reaction gas is supplied from the gas supply pipe 320, the second gas supply system may be referred to as a reaction gas supply system. Further, an inert gas supply system mainly includes the gas supply pipes 510, 520, and 530, the MFC 512, 522, and 532, and the valves 514, 524, and 534.

According to a method of supplying a gas in the embodiments, a gas is transferred via the nozzles 410, 420, and 430 arranged in the preliminary chamber 201a in an annular vertically-long space defined by the inner wall of the inner tube 204 and ends of a plurality of wafers 200. Then, the gas is ejected into the inner tube 204 from the plurality of gas supply holes 410a, 420a, and 430a formed at positions of the nozzles 410, 420, and 430 which face the wafers. More specifically, the process gas or the like is ejected toward a direction parallel to the surface of the wafers 200 by the gas supply hole 410a of the nozzle 410, the gas supply hole 420a of the nozzle 420, and the gas supply hole 430a of the nozzle 430.

An exhaust hole (exhaust port) 204a is a through-hole formed at a sidewall of the inner tube 204 at a position facing the nozzles 410, 420, and 430. For example, the exhaust hole 204a is a slit-shaped through-hole formed elongated in the vertical direction. A gas supplied into the process chamber 201 from the gas supply holes 410a, 420a, and 430a of the nozzles 410, 420, and 430 and flowing on the surface of the wafers 200 passes through the exhaust hole 204a and flows through an exhaust passage 206 including a gap formed between the inner tube 204 and the outer tube 203. Then, the gas which flowed through the exhaust passage 206 flows through an exhaust pipe 231 and is discharged to an outside of the process furnace 202.

The exhaust hole 204a is formed at a position facing the plurality of wafers 200, and a gas supplied from the gas supply holes 410a, 420a, and 430a to the vicinity of the wafers 200 in the process chamber 201 flows toward the horizontal direction and then flows through the exhaust passage 206 via the exhaust hole 204a. The exhaust hole 204a is not limited to being configured by the slit-shaped through-hole, but may be configured by a plurality of holes.

The exhaust pipe 231 configured to exhaust an internal atmosphere of the process chamber 201 is installed at the manifold 209. A pressure sensor 245, which is a pressure detector (pressure detecting part) configured to detect an internal pressure of the process chamber 201, an auto pressure controller (APC) valve 243, and a vacuum pump 246 as a vacuum-exhausting device, are connected to the exhaust pipe 231 sequentially from the upstream side. The APC valve 243 may perform or stop a vacuum-exhausting operation in the process chamber 201 by opening or closing the valve while the vacuum pump 246 is actuated, and may also regulate the internal pressure of the process chamber 201 by adjusting an opening state of the valve while the vacuum pump 246 is actuated. An exhaust system mainly includes the exhaust hole 204a, the exhaust passage 206, the exhaust pipe 231, the APC valve 243, and the pressure sensor 245. The exhaust system may include the vacuum pump 246.

A seal cap 219 serving as a furnace opening lid configured to be capable of hermetically sealing a lower end opening of the manifold 209 is installed under the manifold 209. The seal cap 219 is configured to come into contact with the lower end of the manifold 209 from the lower side in the vertical direction. The seal cap 219 is made of, for example, metal such as stainless steel (SUS), and is formed in a disc shape. An O-ring 220b as a seal making contact with the lower end of the manifold 209 is installed on an upper surface of the seal cap 219. A rotator 267 configured to rotate the boat 217 in which the wafers 200 are accommodated is installed at an opposite side of the process chamber 201 with respect to the seal cap 219. A rotary shaft 255 of the rotator 267 penetrates the seal cap 219 and is connected to the boat 217. The rotator 267 is configured to rotate the wafers 200 by rotating the boat 217. The seal cap 219 is configured to be vertically moved up or down by a boat elevator 115 as an elevator vertically installed outside the outer tube 203. The boat elevator 115 is configured to be capable of loading/unloading the boat 217 into/from the process chamber 201 by moving the seal cap 219 up or down. The boat elevator 115 is configured as a transfer device (transfer system) which transfers the boat 217 and the wafers 200 accommodated in the boat 217 into/out of the process chamber 201.

The boat 217 serving as a substrate support is configured to support a plurality of wafers 200, for example, 25 to 200 wafers 200, in such a state that the wafers 200 are arranged in a horizontal posture and along the vertical direction at intervals with the centers of the wafers 200 aligned with one another. The boat 217 is made of, for example, a heat resistant material such as quartz or SiC. Heat insulating plates 218 made of, for example, a heat resistant material such as quartz or SiC, are supported in a horizontal posture and in multiple stages (not shown) below the boat 217. This configuration makes it difficult to transfer heat from the heater 207 to the seal cap 219. However, the embodiments are not limited to the above-described form. For example, instead of installing the heat insulating plates 218, a heat insulating cylinder configured as a cylindrical member made of a heat resistant material such as quartz or SiC may be installed below the boat 217.

Figure 2:
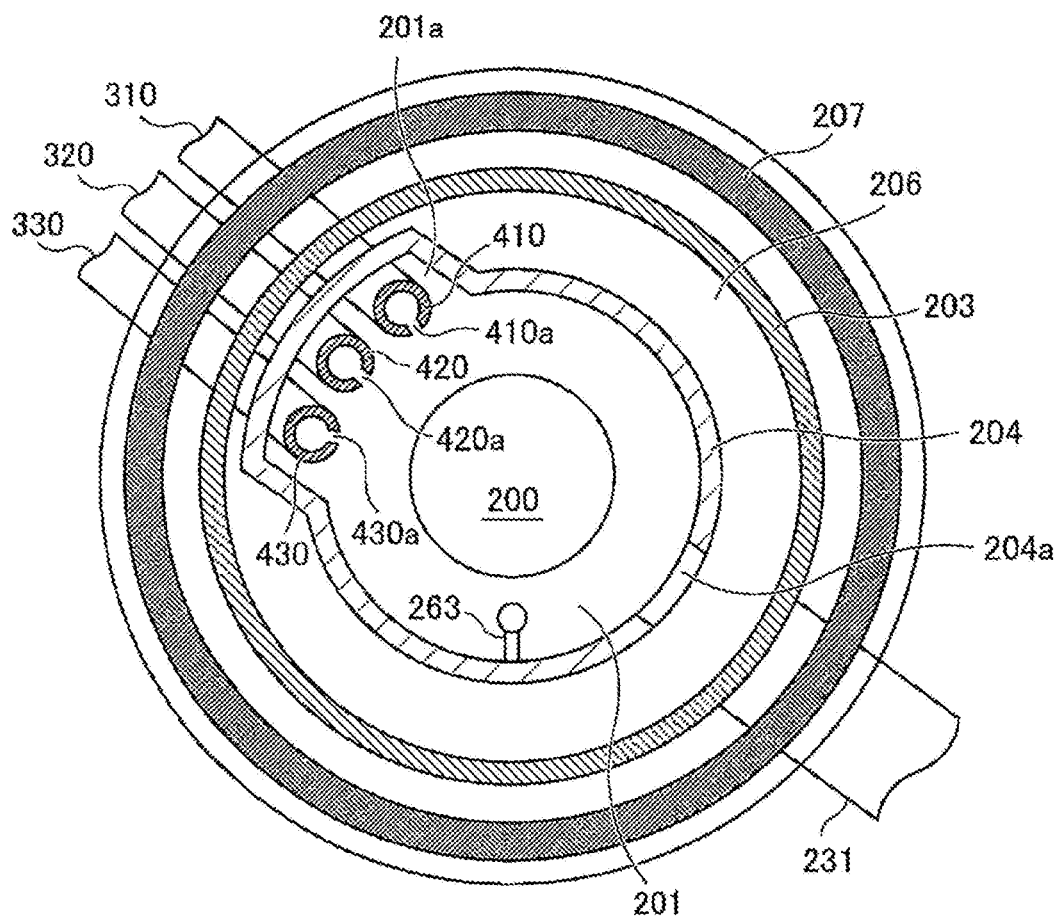
FIG. 2 is a schematic cross-sectional view taken along a line A-A in FIG. 1.

As shown in FIG. 2, a temperature sensor 263 serving as a temperature detector is installed in the inner tube 204. Based on temperature information detected by the temperature sensor 263, a state of supplying electric power to the heater 207 is regulated such that a temperature distribution in the process chamber 201 becomes a desired temperature distribution. The temperature sensor 263 is configured as an L-shape, like the nozzles 410, 420, and 430, and is installed along the inner wall of the inner tube 204.

Figure 3:
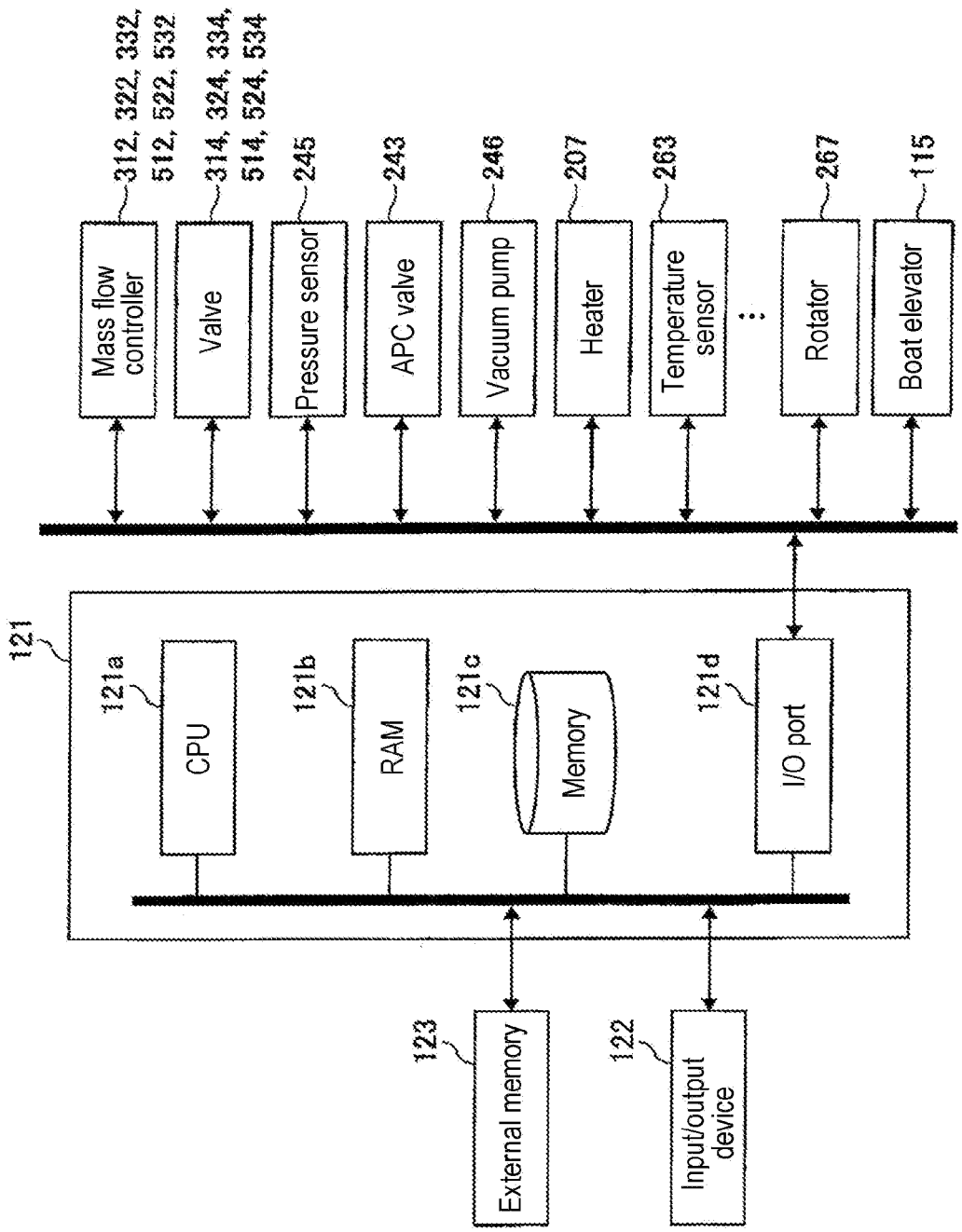
FIG. 3 is a schematic configuration diagram of a controller of a substrate processing apparatus according to embodiments of the present disclosure, in which a control system of the controller is illustrated in a block diagram.

As shown in FIG. 3, a controller 121, which is a control part (control means), may be configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus. An input/output device 122 including, e.g., a touch panel or the like, is connected to the controller 121.

The memory 121c includes, for example, a flash memory, a hard disk drive (HDD), or the like. A control program that controls operations of a substrate processing apparatus, a process recipe, in which sequences, conditions, and the like of a method of manufacturing a semiconductor device, which will be described later, are written, and the like are readably stored in the memory 121c. The process recipe functions as a program that is combined to cause the controller 121 to execute each process (each step) in the method of manufacturing a semiconductor device, which will be described later, to obtain a predetermined result. Hereinafter, the process recipe, the control program, and the like may be generally and simply referred to as a "program." When the term "program" is used herein, it may indicate a case of including the process recipe, a case of including the control program, or a case of including both the process recipe and the control program. The RAM 121b is configured as a memory area (work area) in which a program, data, or the like read by the CPU 121a is temporarily stored.

The I/O port 121d is connected to the MFCs 312, 322, 332, 512, 522, and 532, the valves 314, 324, 334, 514, 524, and 534, the pressure sensor 245, the APC valve 243, the vacuum pump 246, the heater 207, the temperature sensor 263, the rotator 267, the boat elevator 115, and the like.

The CPU 121a is configured to read and execute the control program from the memory 121c. The CPU 121a is also configured to read the recipe and the like from the memory 121c according to an input of an operation command from the input/output device 122, and the like. The CPU 121a is configured to be capable of controlling a flow rate regulation operation of various kinds of gases by the MFCs 312, 322, 332, 512, 522, and 532, an opening/closing operation of the valves 314, 324, 334, 514, 524, and 534, an opening/closing operation of the APC valve 243, a pressure regulation operation performed by the APC valve 243 based on the pressure sensor 245, a temperature regulation operation performed by the heater 207 based on the temperature sensor 263, actuating and stopping of the vacuum pump 246, an operation of rotating the boat 217 with the rotator 267 and adjusting a rotation speed of the boat 217, an operation of moving the boat 217 up or down by the boat elevator 115, an operation of accommodating the wafers 200 in the boat 217, and the like, according to contents of the read recipe.

The controller 121 may be configured by installing, on the computer, the aforementioned program stored in an external memory (for example, a magnetic tape, a magnetic disc such as a flexible disc or a hard disc, an optical disc such as a CD or a DVD, a magneto-optical disc such as a MO, a semiconductor memory such as a USB memory or a memory card, and the like) 123. The memory 121c and the external memory 123 are configured as a computer-readable recording medium. Hereinafter, the memory 121c and the external memory 123 may be generally and simply referred to as a "recording medium." When the term "recording medium" is used herein, it may indicate a case of including the memory 121c a case of including the external memory 123, or a case of including both the memory 121c and the external memory 123. The program may be provided to the computer by using a communication means such as the Internet or a dedicated line, instead of using the external memory 123.

(2) Substrate Processing Process

As a process of manufacturing a semiconductor device, an example of a process of forming a film on a wafer 200 including an oxide film formed on the surface of the wafer 200 will be described with reference to FIGS. 4 and 5A to 5D. The process is performed by using the process furnace 202 of the above-described substrate processing apparatus 10. In the following description, operations of various parts constituting the substrate processing apparatus 10 are controlled by the controller 121.

A substrate processing process (a process of manufacturing a semiconductor device) according to the embodiments of the present disclosure includes:
(a) a step of accommodating a wafer 200 in a process container;
(b) a step of supplying a first gas containing H and O to the wafer 200;
(c) a step of supplying a second gas containing N and H to the wafer 200;
(d) a step of supplying a third gas containing a halogen element to the wafer 200;
(e) a step of supplying a reaction gas to the wafer 200;
(f) a step of performing (b) and (c); and
(g) a step of forming a film on the wafer 200 by performing (d) and (e) after performing (f).

When the term "wafer" is used in the present disclosure, it may refer to "a wafer itself" or "a wafer and a laminated body of certain layers, films, or the like formed on a surface of a wafer." When the phrase "a surface of a wafer" is used in the present disclosure, it may refer to "a surface of a wafer itself" or "a surface of a certain layer, film, or the like formed on a wafer". When the term "substrate" is used in the present disclosure, it may be synonymous with the term "wafer."

(Wafer Loading)

When a plurality of wafers 200 are charged into the boat 217 (wafer charging), as shown in FIG. 1, the boat 217 supporting the plurality of wafers 200 is lifted up by the boat elevator 115 and is loaded into the process chamber 201 (boat loading) and accommodated in the process container. That is, the wafer 200 including an oxide film formed on the surface of the wafer 200 is accommodated in the process container. In this state, the seal cap 219 seals a lower end opening of the outer tube 203 via the O-ring 220.

(Pressure Regulation and Temperature Regulation)

The interior of the process chamber 201, that is, a space where the wafer 200 is placed, is vacuum-exhausted by the vacuum pump 246 to reach a desired pressure (degree of vacuum). At this time, the internal pressure of the process chamber 201 is measured by the pressure sensor 245. The APC valve 243 is feedback-controlled based on the measured pressure information (pressure regulation). The vacuum pump 246 is always in operation at least until processing on the wafers 200 is completed. The interior of the process chamber 201 is heated by the heater 207 to reach a desired temperature. At this time, a state of supplying electric power to the heater 207 is feedback-controlled based on the temperature information detected by the temperature sensor 263 such that a temperature distribution in the process chamber 201 becomes a desired temperature distribution (temperature regulation). Heating the interior of the process chamber 201 by the heater 207 is continuously performed at least until the processing on the wafers 200 is completed.

[Pre-Process] (First Gas Supply)

The valve 314 is opened to allow a first gas to flow through the gas supply pipe 310. A flow rate of the first gas is regulated by the MFC 312, and the first gas is supplied into the process chamber 201 from the gas supply hole 410a of the nozzle 410 and is exhausted via the exhaust pipe 231. At the same time, the valve 514 may be opened to allow an inert gas such as a $N_2$ gas to flow through the gas supply pipe 520. Further, the valves 524 and 534 may be opened to allow an inert gas to flow through the gas supply pipes 520 and 530 to prevent the first gas from penetrating into the nozzles 420 and 430.

At this time, the APC valve 243 is regulated so that the internal pressure of the process chamber 201 is set to a pressure within a range of, for example, 1 to 3,990 Pa. The supply flow rate of the first gas controlled by the MFC 312 is set to a flow rate within a range of, for example, 0.01 to 1 slm. In the following, the temperature of the heater 207 is set to a temperature such that the temperature of the wafer 200 is a temperature within a range of, for example, 300 to 600 degrees C. The notation of a numerical range such as "1 to 3,990 Pa" in the present disclosure means that a lower limit value and an upper limit value are included in the range. Therefore, for example, "1 to 3,990 Pa" means "1 Pa or more and 3,990 Pa or less." The same applies to other numerical ranges.

Figure 5A:
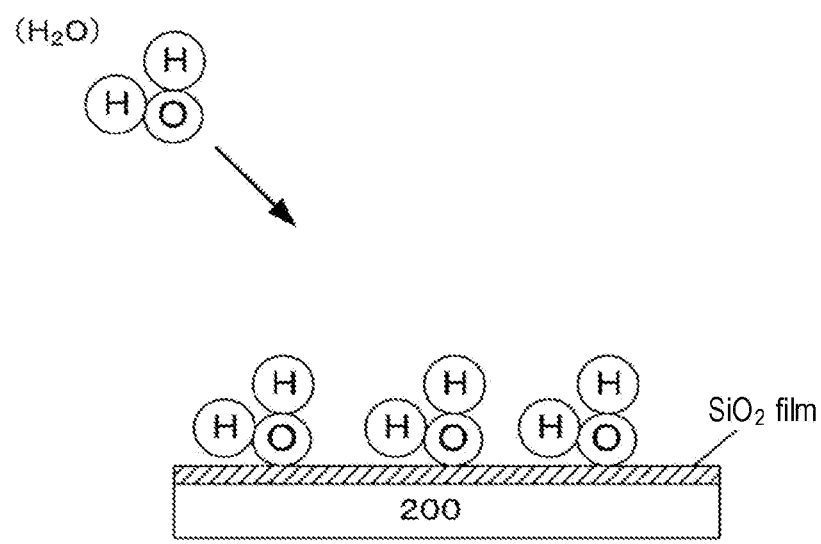
FIGS. 5A to 5D are schematic views explaining a state of a substrate surface in the substrate processing sequence shown in FIG. 4.

In this operation, the first gas is supplied to the wafer 200. As the first gas, for example, water vapor ($H_2O$ gas), which is a gas containing H and O, may be used. When the $H_2O$ gas is used as the first gas, one molecular layer of $H_2O$ molecules is physically adsorbed by supplying the $H_2O$ gas on the wafer 200 (a base film on the surface of the wafer 200)) on which a $SiO_2$ film as an oxide film is formed on the surface of the wafer 200, as shown in FIG. 5A. Here, when a plurality of layers of $H_2O$ molecules are laminated, a second gas, which will be described later, is supplied to react with a surface of the plurality of layers, thus generating an OH group. That is, since the $H_2O$ molecules are present in a lower layer portion, the OH group is not adsorbed on the surface of the wafer 200, and thus the surface of the wafer 200 may not be OH-terminated. Therefore, the first gas is supplied to the wafer 200 under a condition that the one molecular layer of $H_2O$ molecules is physically adsorbed on the wafer 200. That is, the first gas supply is performed in an atmosphere in which the one molecular layer of $H_2O$ molecules is physically adsorbed on the wafer 200. The $H_2O$ molecules tend to be desorbed from the wafer 200 as the temperature rises. Therefore, the temperature in this process is set so that the temperature of the wafer 200 is, for example, as low as possible while being equal to or higher than a boiling point of $H_2O$. For example, the temperature at the time of supplying the first gas is set so that the temperature of the wafer 200 is, for example, equal to or higher than the boiling point of $H_2O$ and is the same as a film-forming temperature in a film-forming process to be described later. Thus, the $H_2O$ molecules may be physically adsorbed on the wafer 200.

(Second Gas Supply)

After a predetermined time elapses from the start of the supply of the first gas, the valve 314 is closed to stop the supply of the first gas into the process chamber 201. At this time, the valve 324 is opened to allow the second gas to flow through the gas supply pipe 320. That is, after the supply of the first gas, the supply of the second gas is started without supplying a purge gas. As a result, it is possible to suppress a decrease in an amount of $H_2O$ molecules physically adsorbed on the wafer 200. A flow rate of the second gas is regulated by the MFC 322, and the second gas is supplied into the process chamber 201 from the gas supply hole 420a of the nozzle 420 and is exhausted via the exhaust pipe 231. In this operation, the second gas is supplied to the wafer 200. At the same time, the valve 524 may be opened to allow an inert gas to flow into the gas supply pipe 520. Further, the valves 514 and 534 may be opened to allow an inert gas to flow through the gas supply pipes 510 and 530, thus preventing the second gas from penetrating into the nozzles 410 and 430. A purge gas may be supplied after the supply of the first gas and before the supply of the second gas. By supplying the purge gas, a reaction between the $H_2O$ gas in the gas phase and the second gas may be suppressed.

At this time, the APC valve 243 is regulated so that the internal pressure of the process chamber 201 is set to a pressure within a range of, for example, 1 to 3,990 Pa. A supply flow rate of the second gas controlled by the MFC 322 is set to a flow rate within a range of, for example, 0.1 to 30 slm. The time for which the second gas is supplied to the wafer 200 is set to a time within a range of, for example, 0.01 to 600 seconds.

Figure 5B:
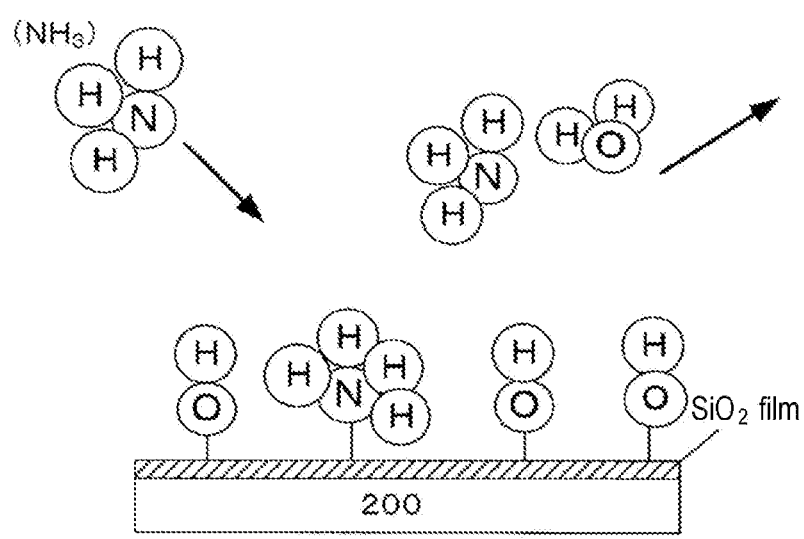

In this operation, the second gas is supplied to the wafer. Here, as the second gas, for example, an ammonia ($NH_3$) gas containing N and H may be used. The second gas is supplied to the wafer 200 under a condition in which the second gas reacts with the $H_2O$ molecules on the wafer 200. That is, the second gas supply is performed in an atmosphere in which the second gas reacts with the $H_2O$ molecules physically adsorbed on the wafer 200. The reaction when the $NH_3$ gas is used as the second gas is shown in FIG. 5B. As shown in FIG. 5B, the $NH_3$ gas reacts with the $H_2O$ molecules adsorbed on the wafer 200 to generate ammonium ($NH_4^+$) and hydroxide ions ($OH^-$). The temperature in this process is set under a condition in which the second gas reacts with the $H_2O$ molecules on the wafer 200. For example, the temperature at the time of supplying the second gas is set so that the temperature of the wafer 200 is, for example, the same as the film-forming temperature in the film-forming process to be described later. Then, $NH_3$, which is the second gas, separates H from $H_2O$ physically adsorbed on the wafer 200 to form an OH termination on the wafer 200. That is, by supplying the second gas, an OH group is adsorbed on the surface of the wafer 200, and the surface of the wafer 200 is terminated with the OH group. In the present disclosure, the terms "terminated" and "adsorbed" may include a state in which the entire surface of the wafer 200 is not covered. Depending on a gas supply condition and a surface condition of the wafer 200, the entire surface of the wafer 200 may not be covered. Further, when a reaction stops in a self-limited manner, the entire surface of the wafer 200 may not be covered.

[Film-Forming Process]

After performing the above-described pre-process, purging is performed, and the following first to fourth steps are performed one or more times. That is, after performing the pre-process and then supplying a purge gas such as a $N_2$ gas into the process chamber 201, the following first to fourth steps are repeatedly performed. That is, after removing the first gas, the second gas, and reaction by-products in the gas phase by purging, in a state where the OH group is adsorbed on the wafer 200, the following first to fourth steps are performed one or more times on the wafer 200 on which the OH group is exposed. By supplying the purge gas to perform the purging after the pre-process and before the film-forming process, reaction by-products and excess gases existing in the process chamber 201 may be removed, thereby improving characteristics of a film formed in the film-forming process.

(Third Gas Supply: First Step)

The valve 334 is opened to allow a third gas to flow through the gas supply pipe 330. A flow rate of the third gas is regulated by the MFC 332, and the third gas is supplied into the process chamber 201 from the gas supply hole 430a of the nozzle 430 and is exhausted via the exhaust pipe 231. At the same time, the valve 534 may be opened to allow an inert gas such as a $N_2$ gas to flow through the gas supply pipe 530. At this time, the valves 514 and 524 may be opened to allow an inert gas to flow through the gas supply pipes 510 and 520, thus preventing the third gas from penetrating into the nozzles 410 and 420.

At this time, the APC valve 243 is regulated such that the internal pressure of the process chamber 201 is set to a pressure within a range of, for example, 1 to 3,990 Pa. The supply flow rate of the third gas controlled by the MFC 332 is set to a flow rate within a range of, for example, 0.1 to 3.0 slm. In the following, the temperature of the heater 207 is set to a temperature such that the temperature of the wafer 200 is a temperature within a range of, for example, 300 to 600 degrees C. The time for which the third gas is supplied to the wafer 200 is set to a time within a range of, for example, 0.01 to 60 seconds.

Figure 5C:
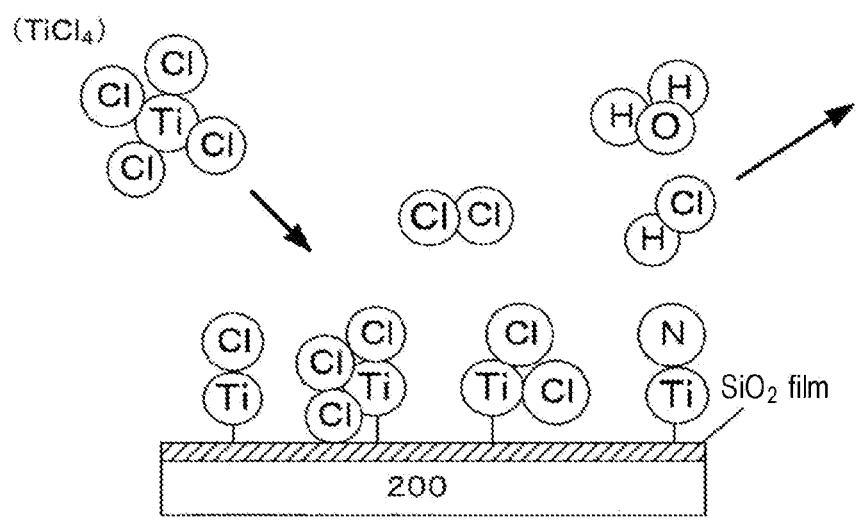

In this operation, the third gas is supplied to the wafer 200 on which the OH group is adsorbed, that is, the wafer 200 whose surface is terminated with the OH group. Here, as the third gas, it may be possible to use, e.g., a titanium tetrachloride ($TiCl_4$) gas containing titanium (Ti) and a halogen element. When the $TiCl_4$ gas is used as the third gas, the result is shown in FIG. 5C. That is, when the $TiCl_4$ gas is supplied to the wafer 200 on which the OH group is exposed as shown in FIG. 5B, halogen (Cl) contained in the $TiCl_4$ gas reacts with the OH group existing on the wafer 200 to cause $TiCl_x$ (x is smaller than 4) to be adsorbed on the wafer 200 as shown in FIG. 5C. That is, since $TiCl_x$ of a molecular size smaller than that of $TiCl_4$ is adsorbed on the wafer 200, a size (molecular weight) of steric hindrance may be reduced as compared with the case where $TiCl_4$ is adsorbed. That is, since adsorption inhibition of $TiCl_4$ due to the steric hindrance may be suppressed, it is possible to increase an adsorption amount of $TiCl_x$ of a small molecular size. In other words, when the $TiCl_4$ gas is supplied to the wafer 200 on which the OH group is adsorbed, since an amount of adsorption of a Ti element on the wafer 200 may be increased. Therefore, an adsorption density of the Ti element adsorbed on the wafer 200 (a base film on the surface of the wafer 200) may be increased, and a Ti-containing layer of a high content of the Ti element may be formed. At this time, reaction by-products such as hydrochloric acid (HCl) and $H_2O$ are generated. Most of these reaction by-products are desorbed from the wafer 200. As a result, it is possible to suppress residual impurities in the underlying $SiO_2$ film and a TiN film formed on the $SiO_2$ film.

(Purging: Second Step)

After a predetermined time elapses from the start of the supply of the third gas, for example, after 0.1 to 10 seconds elapses, the valve 334 is closed to stop the supply of the third gas. At this time, the APC valve 243 of the exhaust pipe 231 is left open to vacuum-exhaust the interior of the process chamber 201 by the vacuum pump 246 such that a residual gas is removed from the wafer 200, whereby the unreacted third gas and reaction by-products remaining in the process chamber 201 are excluded from the interior of the process chamber 201. At this time, the valves 514, 524, and 534 are opened to allow an inert gas as a purge gas to be supplied into the process chamber 201. The inert gas may act as the purge gas to remove the residual gas from the wafer 200, thereby excluding the unreacted third gas and reaction by-products remaining in the process chamber 201 from the interior of the process chamber 201. The supply flow rates of the inert gases controlled by the MFC 512, 522, and 532 are set to, for example, 0.1 to 30 slm, respectively.

(Reaction Gas Supply: Third Step)

After a predetermined time elapses from the start of purging, for example, after 0.1 to 10 seconds elapses, the valves 514, 524, and 534 are closed to stop the supply of the inert gas into the process chamber 201. At this time, the valve 324 is opened to allow a reaction gas to flow through the gas supply pipe 320. A flow rate of the reaction gas is regulated by the MFC 322, and the reaction gas is supplied into the process chamber 201 from the gas supply hole 420a of the nozzle 420 and is exhausted via the exhaust pipe 231. In this operation, the reaction gas is supplied to the wafer 200. At the same time, the valve 524 may be opened to allow an inert gas to flow through the gas supply pipe 520. Further, the valves 514 and 534 may be opened to allow the inert gas to flow through the gas supply pipes 510 and 530 to prevent the reaction gas from penetrating into the nozzles 410 and 430.

At this time, the APC valve 243 is regulated such that the internal pressure of the process chamber 201 is set to a pressure within a range of, for example, 1 to 3,990 Pa. The supply flow rate of the reaction gas controlled by the MFC 322 is set to a flow rate within a range of, for example, 0.1 to 30 slm. The time for which the reaction gas is supplied to the wafer 200 is set to a time within a range of, for example, 0.01 to 30 seconds.

Figure 5D:
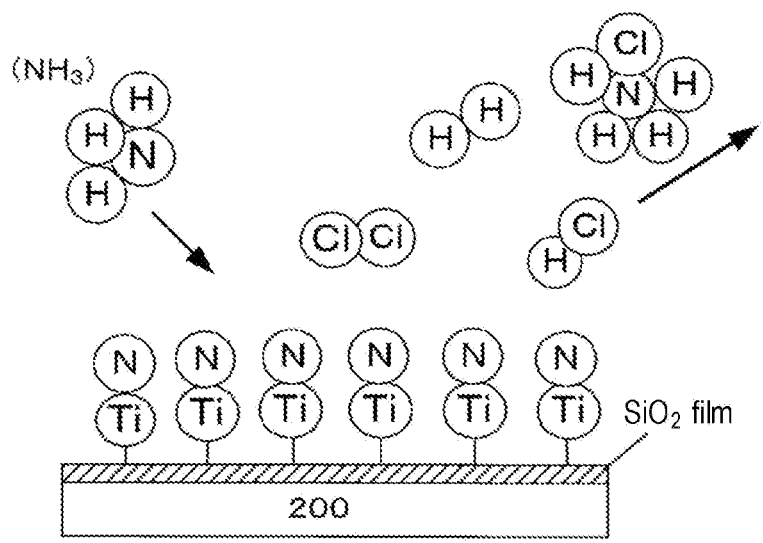

In this operation, the reaction gas is supplied to the wafer. Here, as the reaction gas, it may be possible to use, e.g., an ammonia ($NH_3$) gas. A reaction when the $NH_3$ gas is used as the reaction gas is shown in FIG. 5D. As shown in FIG. 5D, the $NH_3$ gas undergoes a substitution reaction with at least a portion of the Ti-containing layer formed on the wafer 200. At the time of the substitution reaction, Ti contained in the Ti-containing layer and N contained in the $NH_3$ gas are bonded to form a TiN layer on the wafer 200. Specifically, when TiCl adsorbed on the wafer 200 reacts with $NH_3$, a TiN film is formed on the wafer 200 including an oxide film formed on the surface of the wafer 200, thereby improving a coverage of the TiN film. In addition, reaction by-products such as HCl, ammonium chloride ($NH_4Cl$), and $H_2$ are generated at the time of the substitution reaction.

(Purging: Fourth Step)

After a predetermined time elapses from the start of the supply of the reaction gas, for example, after 0.01 to 60 seconds elapses, the valve 324 is closed to stop the supply of the reaction gas. At this time, the APC valve 243 of the exhaust pipe 231 is left open to vacuum-exhaust the interior of the process chamber 201 by the vacuum pump 246 such that a residual gas is removed from the wafer 200, whereby an unreacted reaction gas or a reaction gas which contributed to the film formation and reaction by-products remaining in the process chamber 201 are excluded from the process chamber 201. At this time, the valves 514, 524, and 534 are opened to allow an inert gas as a purge gas to be supplied into the process chamber 201. The inert gas may act as the purge gas to remove the residual gas from the wafer 200, thereby excluding the unreacted reaction gas and the reaction by-products remaining in the process chamber 201 from the interior of the process chamber 201. The supply flow rates of the inert gases controlled by the MFC 512, 522, and 532 are set to, for example, 0.1 to 30 slm, respectively.

That is, the unreacted reaction gas or the reaction gas which contributed to the film formation and the reaction by-products remaining in the process chamber 201 are excluded from the process chamber 201. The inert gas acts as the purge gas.

(Performing Predetermined Number of Times)

After performing the pre-process, a film of a predetermined thickness is formed on the wafer 200 by performing a cycle a predetermined number of times (N times) (once or more), the cycle including sequentially performing the described-above first to fourth steps. Here, for example, a TiN film is formed.

(After-Purge and Returning to Atmospheric Pressure)

An inert gas is supplied into the process chamber 201 from each of the gas supply pipes 510 to 530 and is exhausted via the exhaust pipe 231. The inert gas acts as a purge gas, whereby the interior of the process chamber 201 is purged with the inert gas to remove a gas and reaction by-products remaining in the process chamber 201 from the interior of the process chamber 201 (after-purge). After that, the internal atmosphere of the process chamber 201 is substituted with the inert gas (inert gas substitution), and the internal pressure of the process chamber 201 is returned to the atmospheric pressure (returning to atmospheric pressure).

(Wafer Unloading)

Thereafter, the seal cap 219 is moved down by the boat elevator 115 to open the lower end of the outer tube 203. Then, the processed wafers 200 supported by the boat 217 are unloaded from the lower end of the outer tube 203 to the outside of the outer tube 203 (boat unloading). After that, the processed wafers 200 are discharged from the boat 217 (wafer discharging).

(3) Effects of the Embodiments

According to the embodiments of the present disclosure, one or more effects set forth below may be achieved.

(a) Since a coverage of a film may be improved, it is possible to reduce a resistivity of a metal-containing film formed on this film.
(b) It is possible to continuously grow the film. Here, "continuous" means that crystals of a material of the film are continuous, a crystal spacing is small, and the like.
(c) It is possible to improve characteristics of a film formed on a substrate.
(d) Specifically, it is possible to improve a coverage of a film formed on an oxide film.
(e) Specifically, it is possible to continuously grow a film formed on an oxide film.

(4) Other Embodiments

The embodiments of the present disclosure are specifically described above. However, the present disclosure is not limited to the above-described embodiments, and various modifications may be made without departing from the gist of the present disclosure.

In the above-described embodiments, as the pre-process, the examples in which the first gas supply and the second gas supply are performed once in this order are described, but the present disclosure is not limited thereto. The present disclosure may be applied to a case where the first gas supply and the second gas supply may be performed a plurality of times or a case where the sequence of gas supply in the pre-process may be changed such that the first gas is supplied after the second gas is supplied.

(Modification 1)

FIG. 6 shows a modification of the substrate processing sequence according to the embodiments of the present disclosure. In this modification, as the pre-process, a cycle including sequentially performing the above-described first gas supply and second gas supply is performed a predetermined number of times (M times). That is, before performing the film-forming process, as the pre-process, a cycle including sequentially performing a step of supplying the first gas to the wafer 200 and a step of supplying the second gas to the wafer 200 is performed a plurality of times. At this time, a purge gas is not supplied between the first gas supply and the second gas supply, as in the above embodiments. Even in this case, the same effects as those in the above-described substrate processing sequence shown in FIG. 4 may be obtained.

Figure 7A:
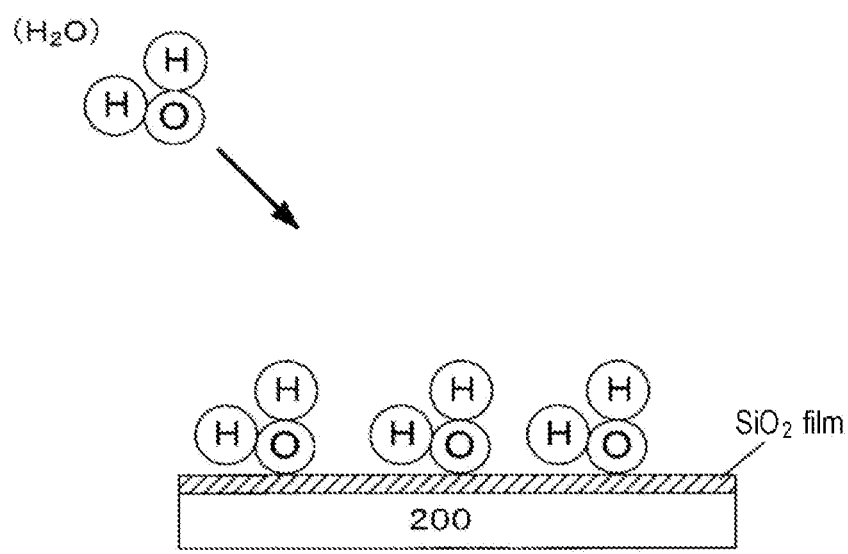
FIGS. 7A to 7D are schematic views explaining a state of a substrate surface in the substrate processing sequence shown in FIG. 6.
Figure 7B:
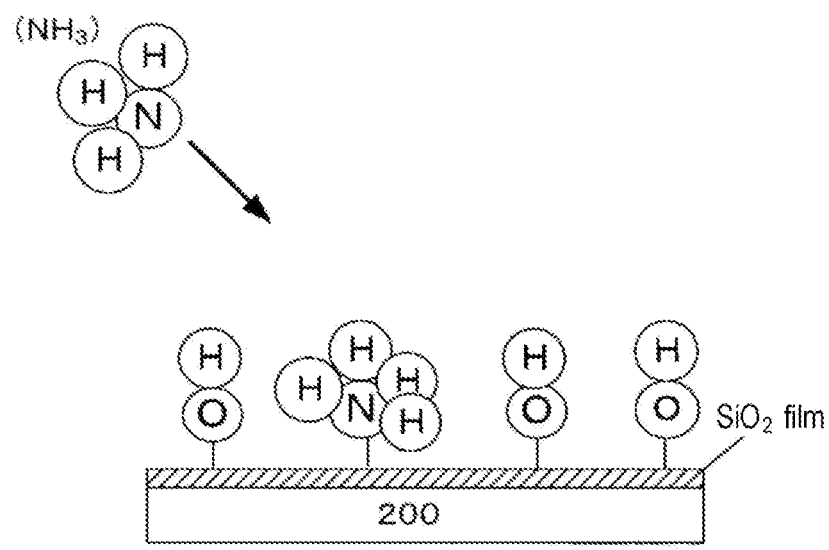
Figure 7C:
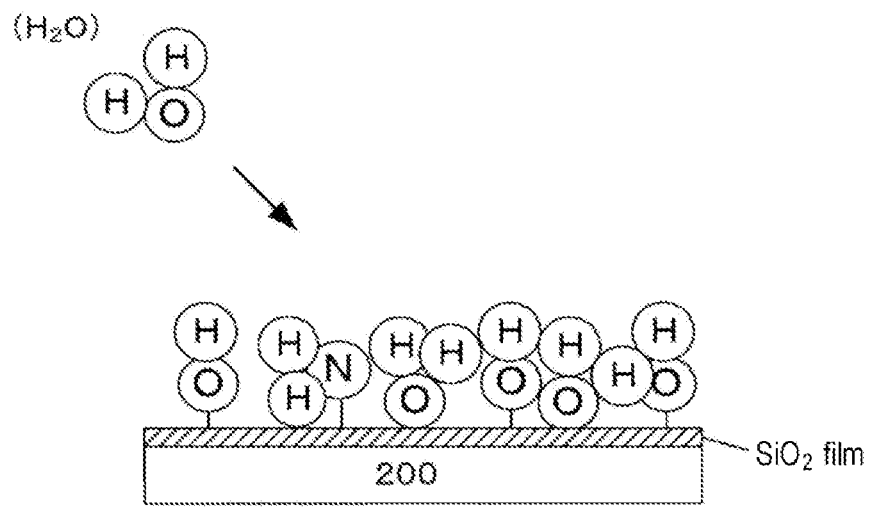
Figure 7D:
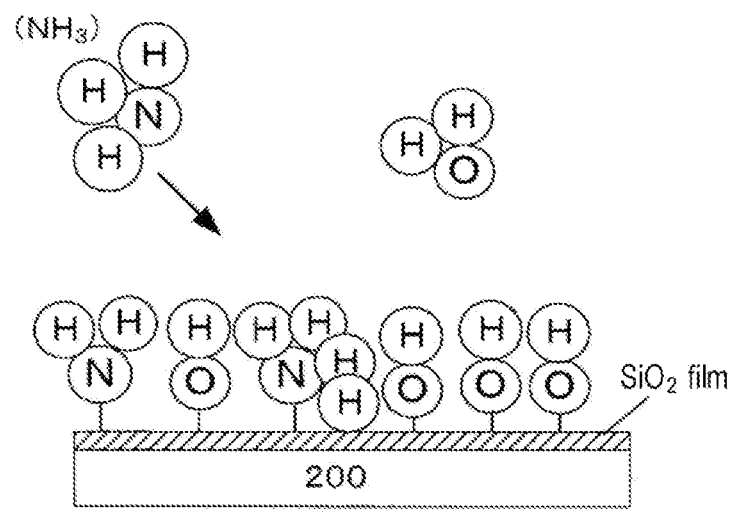
Figure 8A:
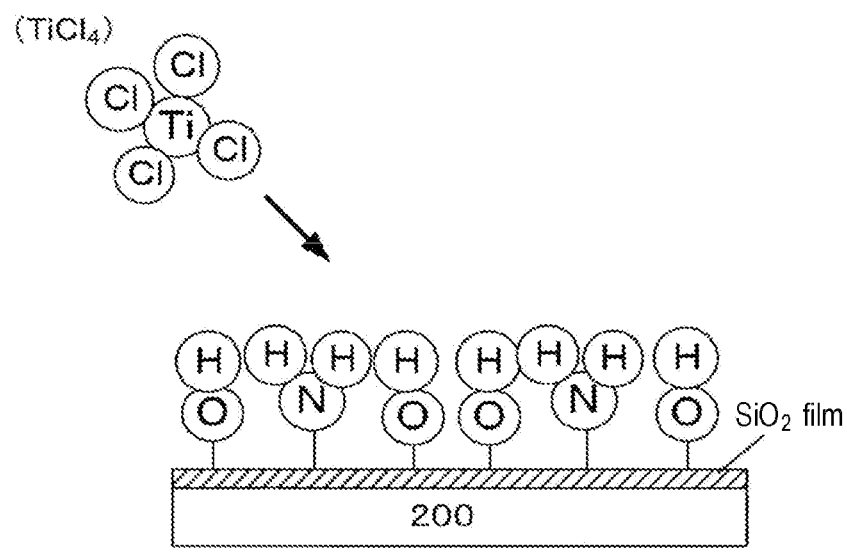
FIGS. 8A to 8D are schematic views explaining the state of the substrate surface in the substrate processing sequence shown in FIG. 6.
Figure 8B:
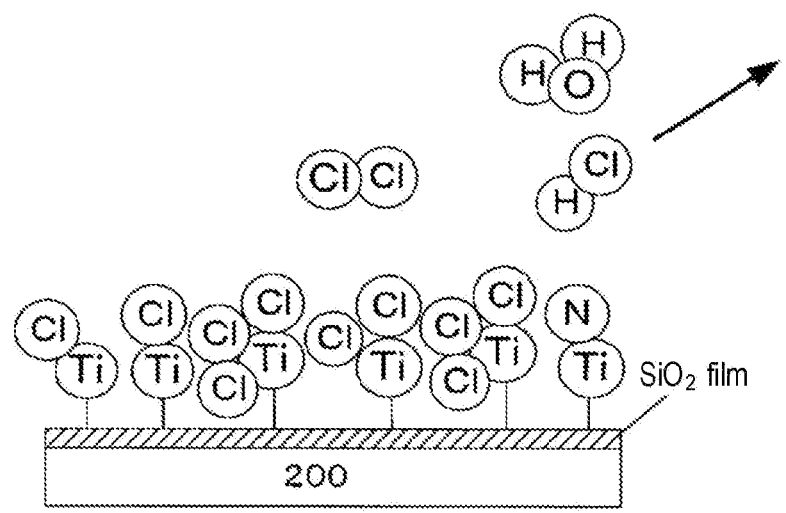
Figure 8C:
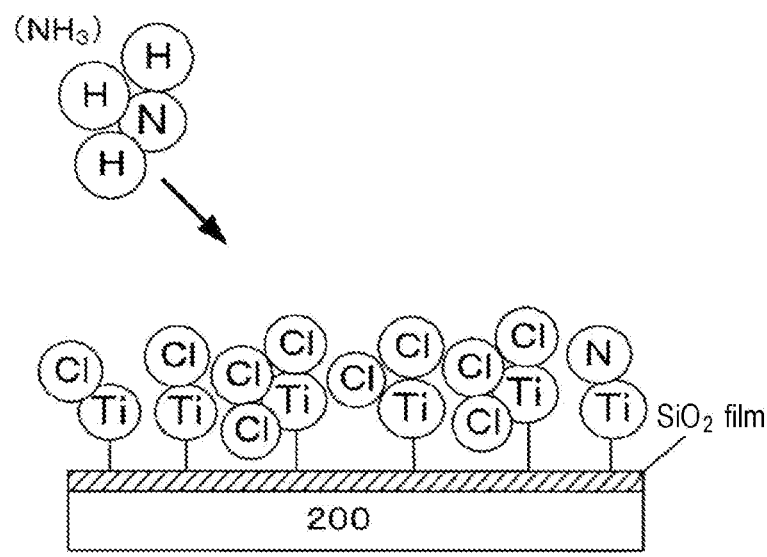
Figure 8D:
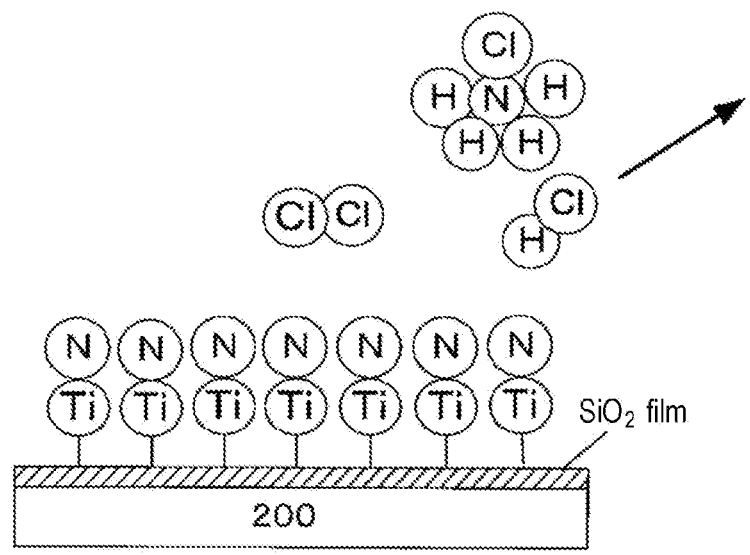

A reaction in a case where a $H_2O$ gas is used as the first gas, a $NH_3$ gas is used as the second gas and the reaction gas, and a $TiCl_4$ gas is used as the third gas is shown in FIGS. 7A to 7D and 8A to 8D. By supplying the $H_2O$ gas, as shown in FIG. 7A, one molecular layer of $H_2O$ molecules is physically adsorbed on the wafer 200 including a $SiO_2$ film formed on the surface of the wafer 200. Then, by supplying the $NH_3$ gas, as shown in FIG. 7B, the $NH_3$ gas reacts with the $H_2O$ molecules adsorbed on the wafer 200 to generate ammonium ($NH_4^+$) and hydroxide ions ($OH^-$), thereby forming an OH termination on the wafer 200. Then, by supplying the $H_2O$ gas at and after the second time, as shown in FIG. 7C, the $H_2O$ molecules are adsorbed on an empty site on the wafer 200 where no OH group is adsorbed. Then, by supplying the $NH_3$ gas at and after the second time, as shown in FIG. 7D, $H_2O$ physically adsorbed on the wafer 200 reacts with $NH_3$ to generate $NH_4^+$ and $OH^-$, thereby forming an OH termination at the empty site on the wafer. Further, when $NH_3$ reacts with some of OH groups adsorbed on the wafer 200, NIH (where x is 2 or less, and, for example, $NH_2$ is generated) and $H_2O$ are generated, whereby $NH_2$ is adsorbed on the wafer 200. That is, a $NH_x$ termination is formed on the wafer 200, thereby forming an OH termination and a NH termination on the wafer 200. Here, since $TiCl_x$ is easily adsorbed on the OH termination and the NH termination, the OH termination and the NH termination on the wafer 200 may be increased by repeatedly supplying the first gas and the second gas, as the pre-process, as in this modification. Then, as shown in FIGS. 8B and 8C, an adsorption amount of $TiCl_x$ of a small molecular size may be increased, so that an adsorption inhibition of $TiCl_4$ due to steric hindrance may be suppressed, thereby promoting the adsorption of $TiCl_x$. Then, by supplying the $NH_3$ gas, it is possible to improve the coverage of the TiN film, thereby suppressing residual impurities in the underlying $SiO_2$ film and a TiN film formed on the $SiO_2$ film.

(Modification 2)

Figure 9:
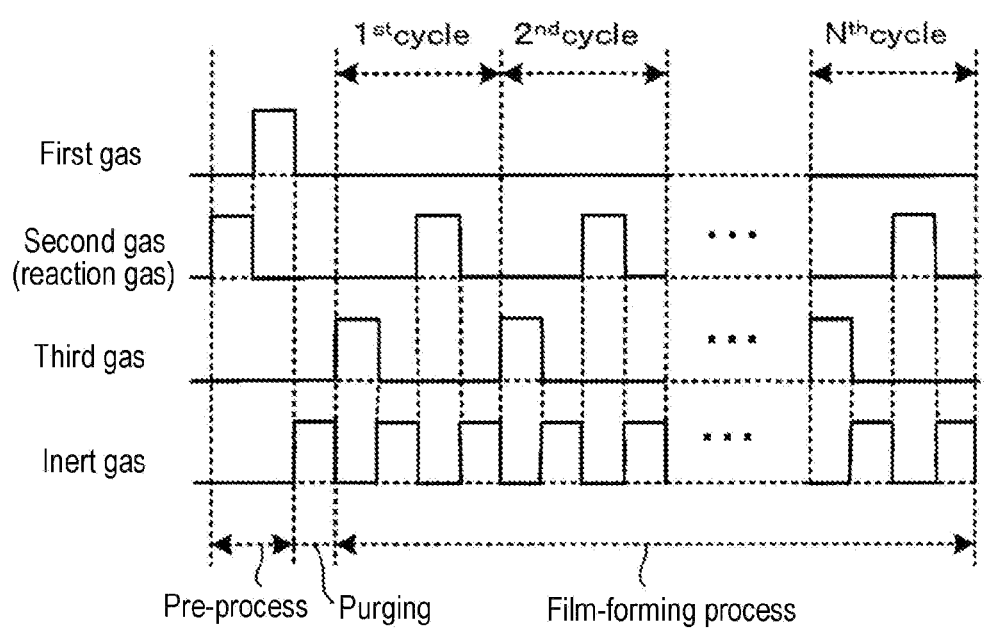
FIG. 9 is a diagram showing a modification of a substrate processing sequence according to embodiments of the present disclosure.

FIG. 9 shows another modification of the substrate processing sequence according to the embodiments of the present disclosure. In this modification, as the pre-process, the first gas is supplied after the second gas is supplied, and then purging is performed and the above-described film-forming process are performed. That is, before the film-forming process is performed, as the pre-process, a step of supplying the second gas to the wafer 200 and a step of supplying the first gas to the wafer 200 are performed once in this order. At this time, a purge gas is not supplied between the second gas supply and the first gas supply. Even in this case, the same effects as those in the above-described substrate processing sequence shown in FIG. 4 may be obtained.

Figure 10A:
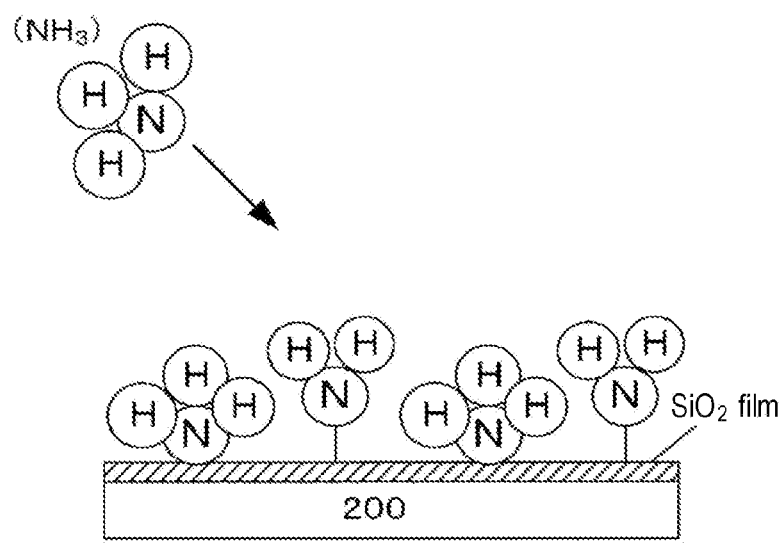
FIGS. 10A to 10D are schematic views explaining a state of a substrate surface in the substrate processing sequence shown in FIG. 9.
Figure 10B:
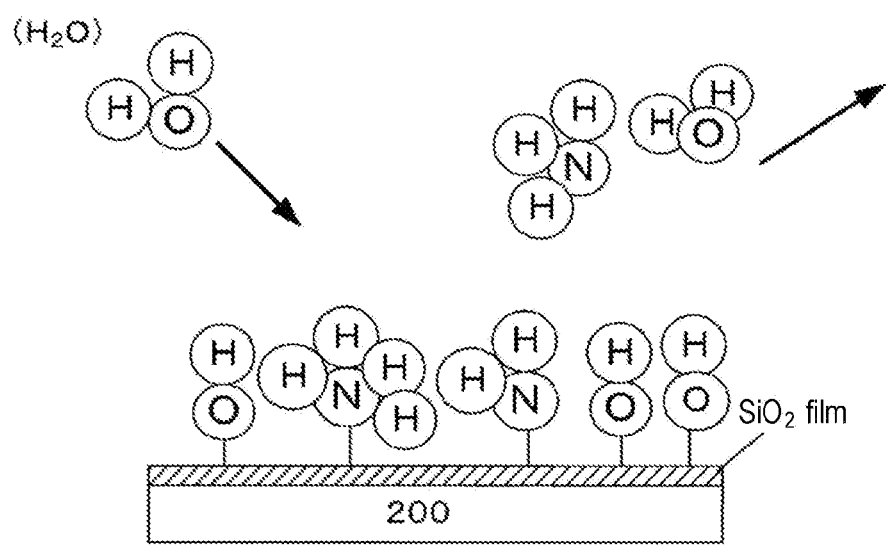
Figure 10C:
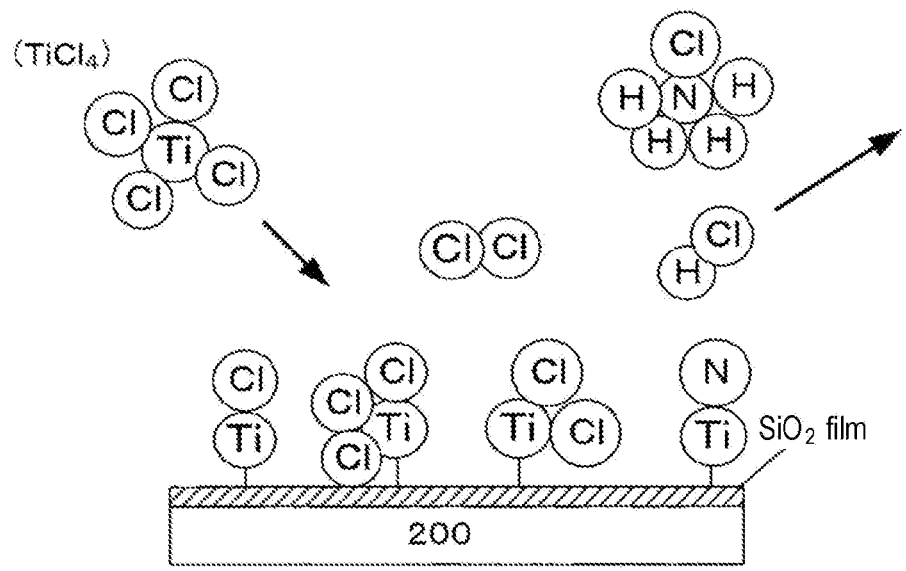
Figure 10D:
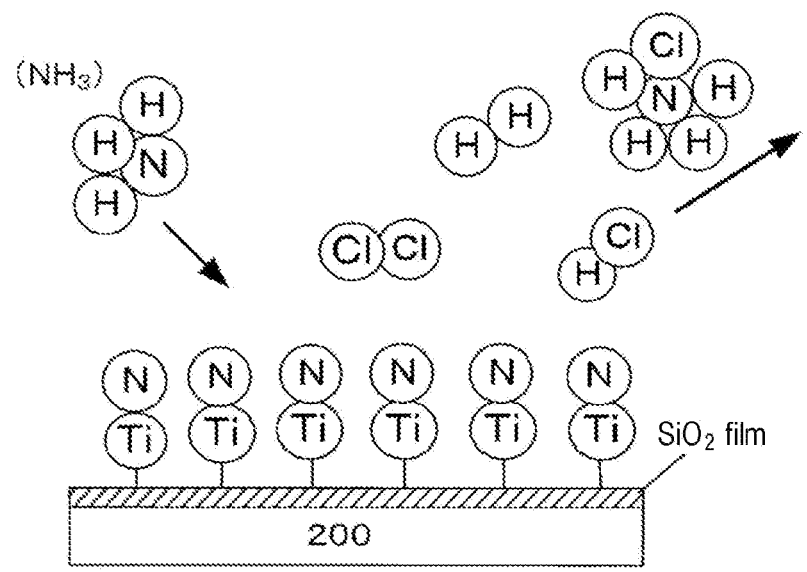

A reaction in a case where a $H_2O$ gas is used as the first gas, a $NH_3$ gas is used as the second gas and the reaction gas, and a $TiCl_4$ gas is used as the third gas is shown in FIGS. 10A to 10D. As shown in FIG. 10A, by supplying the $NH_3$ gas to the wafer 200 including a $SiO_2$ film as an oxide film formed on the surface of the wafer 200, $NH_3$ is physically adsorbed on the wafer 200 or $NH_2$ is chemically adsorbed on the wafer 200. Then, as shown in FIG. 10B, $H_2O$ is physically adsorbed on an empty site by supplying the $H_2O$ gas on the wafer 200 on which $NH_3$ or $NH_2$ are adsorbed, in an atmosphere where the $H_2O$ gas is physically adsorbed on the wafer 200. Further, $NH_3$ reacts with $H_2O$ to generate $NH_4^+$ and $OH^-$, thereby forming an OH termination on the wafer 200. Further, $NH_2$ reacts with $H_2O$ to generate $NH_x^+$ and $OH^-$, thereby forming an OH termination on the wafer 200. Then, as shown in FIG. 10C, by supplying the $TiCl_4$ gas, an adsorption amount of TiCl of a small molecular size may be increased such that an adsorption inhibition of $TiCl_4$ due to steric hindrance may be suppressed, thereby promoting the adsorption of $TiCl_x$. Then, as shown in FIG. 10D, by supplying the $NH_3$ gas, it is possible to improve the coverage of the TiN film, thereby suppressing residual impurities in the underlying $SiO_2$ film and a TiN film formed on the $SiO_2$ film.

(Modification 3)

FIG. 11 shows another modification of the substrate processing sequence according to the embodiments of the present disclosure. In this modification, as the pre-process, a cycle including sequentially performing the above-described second gas supply and first gas supply is performed a predetermined number of times (M times), and the purging is performed. Thereafter, the above-described film-forming process is performed. That is, before performing the film-forming process, as the pre-process, a cycle including sequentially performing a step of supplying the second gas to the wafer 200 and a step of supplying the first gas to the wafer 200 is performed a plurality of times. At this time, a purge gas is not supplied between the second gas supply and the first gas supply. Even in this case, the same effects as those in the above-described substrate processing sequence shown in FIG. 4 may be obtained.

In a case where a $H_2O$ gas is used as the first gas, a $NH_3$ gas is used as the second gas and the reaction gas, and a $TiCl_4$ gas is used as the third gas, by supplying the $NH_3$ gas to the wafer 200 including a $SiO_2$ film as an oxide film formed on the surface of the wafer 200, $NH_3$ is physically adsorbed on the wafer 200 or $NH_2$ is chemically adsorbed on the wafer 200. Then, by supplying the $H_2O$ gas to the wafer 200 on which $NH_3$ or $NH_2$ are adsorbed, in an atmosphere where the $H_2O$ gas is physically adsorbed on the wafer 200, $NH_3$ reacts with $H_2O$ to generate $NH_4^+$ and $OH^-$, thereby forming an OH termination on the wafer 200. Further, $NH_2$ reacts with $H_2O$ to generate $NH_x^+$ and $OH^-$, thereby forming the OH termination on the wafer 200.

Then, by supplying the $NH_3$ gas at and after the second time, an OH group formed on the wafer 200 reacts with $NH_3$ to generate $NH_2$ and $H_2O$, and $NH_2$ is chemically adsorbed on the wafer 200. That is, a $NH_x$ termination is formed on the wafer 200. Then, by supplying the $H_2O$ gas at and after the second time, $NH_2$ reacts with $H_2O$ to generate $NH_x^+$ and $OH^-$, thereby forming an OH termination on the wafer 200. Further, $H_2O$ is physically adsorbed on an empty site on the wafer 200 where no OH termination is formed. Then, the physically adsorbed $H_2O$ reacts with $NH_3$ to generate $NH_4^+$ and $OH^-$, thereby forming an OH termination at the empty site on the wafer. As in this modification, the OH termination on the wafer 200 may be increased by repeatedly supplying the second gas and the first gas a plurality of times, thereby increasing an adsorption amount of TiCl of a small molecular size. That is, an adsorption inhibition of $TiCl_4$ due to steric hindrance may be suppressed, thereby promoting the adsorption of $TiCl_x$. Then, by supplying the $NH_3$ gas, it is possible to improve a coverage of the TiN film, thereby suppressing residual impurities in the underlying $SiO_2$ film and the TiN film formed on the $SiO_2$ film.

In the above-described embodiments, the case where the same $NH_3$ gas as the reaction gas used in the film-forming process is used as the second gas used in the pre-process is described but the present disclosure is not limited thereto, and a gas different from the reaction gas used in the film-forming process may be used.

Further, in the above-described embodiments, the form in which the purging is performed between the pre-process and the film-forming process is shown but the present disclosure is not limited thereto, and the purging may not be performed between the pre-process and the film-forming process.

Further, in the above-described embodiments, the form in which the purging is not performed between the first gas supply and the second gas supply is shown but the present disclosure is not limited thereto, and purging may be performed between the first gas supply and the second gas supply. Thus, it is possible to suppress a reaction between the first gas and the second gas in a gas phase existing in the process chamber 201.

Further, in the above-described embodiments, the case where the pre-process and the film-forming process are performed on the wafer 200 including the $SiO_2$ film containing silicon (Si) as an oxide film formed on the surface of the wafer 200 is described, but the present disclosure is not limited thereto. The present disclosure may be suitably applied to a case of using a wafer 200 on which an oxide film containing at least one or more selected from the group of Si, aluminum (Al), germanium (Ge), gallium (Ga), zirconium (Zr), Ti, and hafnium (Hf) is formed.

Further, in the above-described embodiments, the case where, for example, the $H_2O$ gas is used as the first gas containing H and O in the pre-process is described, but the present disclosure is not limited thereto. The present disclosure may be suitably applied to a case of using a gas containing at least one or more selected from the group of $H_2$ and $O_2$, $H_2O$, and hydrogen peroxide ($H_2O_2$) as the first gas.

Further, in the above-described embodiments, the case where, for example, the $NH_3$ gas is used as the second gas containing N and H in the pre-process is described, but the present disclosure is not limited thereto. The present disclosure may be suitably applied to a case of using a gas containing at least one or more selected from the group of $NH_3$, $N_2$ and $H_2$, diazene ($N_2H_2$), triazene ($N_3H_3$), and hydrazine ($N_2H_4$), and other amine group-containing gases as the second gas.

Further, in the above-described embodiments, the case where, for example, the $TiCl_4$ gas containing Cl as a halogen element is used as the third gas containing a halogen element in the film-forming process is described, but the present disclosure is not limited thereto. The present disclosure may be suitably applied to a case of using a gas containing Cl or fluorine (F) as a halogen element and containing at least one or more selected from the group of a Group IV element such as Ti, Zr, or Hf, and a Group VI element such as molybdenum (Mo) or tungsten (W). Further, the present disclosure may be suitably applied to a case of using a gas containing Cl or F as a halogen element and containing at least one or more selected from the group of a Group XIV element such as Si, a Group XIII element such as Al, and a Group V element such as tantalum (Ta).

For example, the present disclosure may be suitably applied to a case of using, as the third gas, an $MB_y$ gas such as a silicon tetrachloride ($SiCl_4$) gas, a molybdenum pentachloride ($MoCl_5$) gas, an aluminum chloride ($AlCl_3$) gas, a molybdenum dichloride dioxide ($MoO_2Cl_2$) gas, a tungsten hexafluoride ($WF_6$) gas, or the like. In this case, an adsorption amount of $MB_x$ (x is smaller than y), which is smaller in number than halogen element contained in the third gas and is small in a molecular size, may be increased on the OH group formed on the wafer 200, whereby it is possible to suppress an adsorption inhibition of $MB_y$ due to steric hindrance, thereby promoting the adsorption of $MB_x$.

Further, in the above-described embodiments, the example in which the film is formed by using the substrate processing apparatus which is a batch-type vertical substrate processing apparatus configured to process a plurality of substrates at a time is described, but the present disclosure is not limited thereto. The present disclosure may also be suitably applied to a case where a film is formed by using a single-wafer type substrate processing apparatus configured to process a single substrate or several substrates at a time.

Figure 12A:
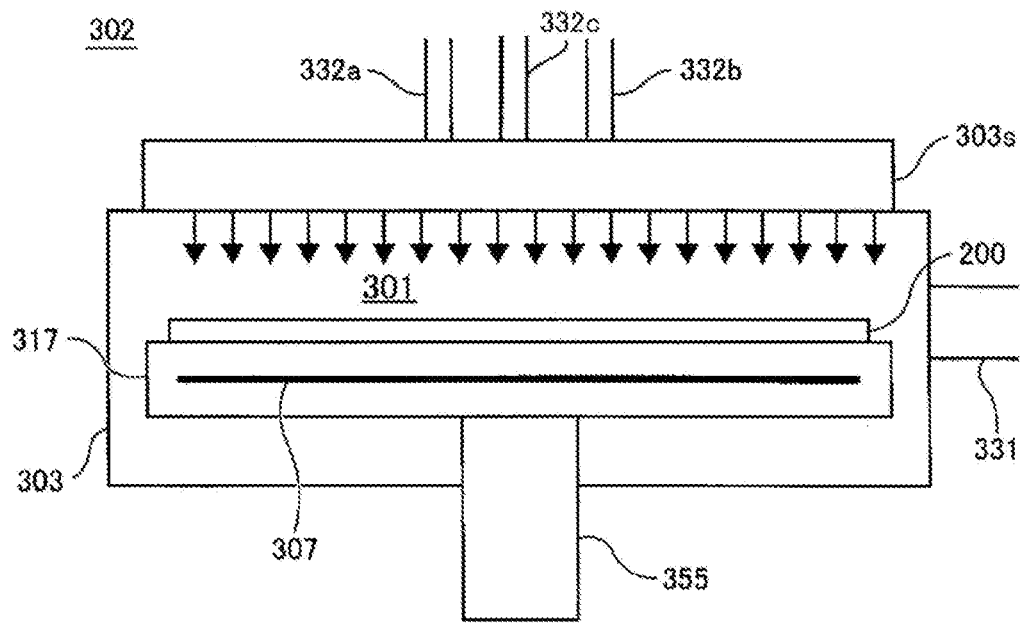
FIGS. 12A and 12B are longitudinal sectional views schematically showing the outline of a process furnace of a substrate processing apparatus according to other embodiments of the present disclosure.

For example, the present disclosure may also be suitably applied to a case where a film is formed by using a substrate processing apparatus including a process furnace 302 shown in FIG. 12A. The process furnace 302 includes a process container 303 forming a process chamber 301, a shower head 303s configured to supply a gas into the process chamber 301 in a shower shape, a support 317 configured to support one or several wafers 200 in a horizontal posture, a rotary shaft 355 configured to support the support 317 from below, and a heater 307 installed at the support 317. A gas supply port 332a configured to supply the above-described first gas, a gas supply port 332b configured to supply the above-described second gas, and a gas supply port 332c configured to supply the above-described third gas are connected to an inlet (gas introduction port) of the shower head 303s. A first gas supply system similar to the first gas supply system in the above-described embodiments is connected to the gas supply port 332a. A second gas supply system similar to the second gas supply system in the above-described embodiments is connected to the gas supply port 332b. A third gas supply system similar to the above-described third gas supply system is connected to the gas supply port 332c. A gas distribution plate configured to supply a gas in a shower shape into the process chamber 301 is installed at an outlet (gas discharge port) of the shower head 303s. An exhaust port 331 configured to exhaust the interior of the process chamber 301 is installed at the process container 303. An exhaust system similar to the exhaust system in the above-described embodiments is connected to the exhaust port 331.

Figure 12B:
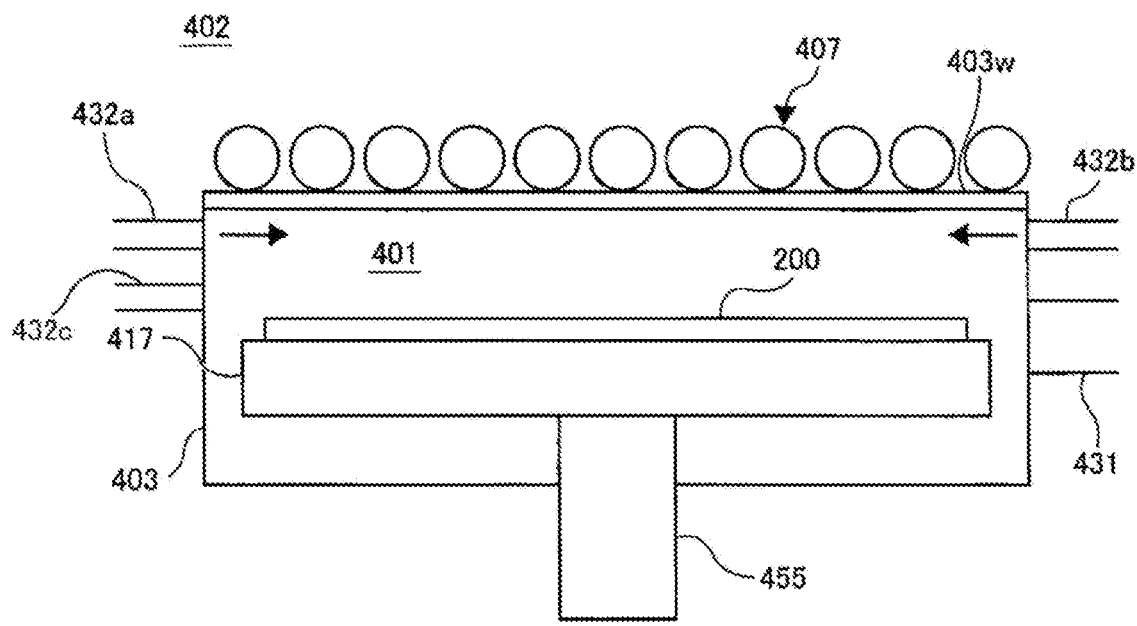

Further, for example, the present disclosure may be suitably applied to even a case where a film is formed by using a substrate processing apparatus including a process furnace 402 shown in FIG. 12B. The process furnace 402 includes a process container 403 forming a process chamber 401, a support 417 configured to support one or several wafers 200 in a horizontal position, a rotary shaft 455 configured to support the support 417 from below, a lamp heater 407 configured to irradiate the wafers 200 of the process container 403 with light, and a quartz window 403w configured to transmit the light of the lamp heater 407. A gas supply port 432a configured to supply the above-described first gas, a gas supply port 432b configured to supply the above-described second gas, and a gas supply port 432c configured to supply the above-described third gas are connected to the process container 403. A first gas supply system similar to the first gas supply system in the above-described embodiments is connected to the gas supply port 432a. A second gas supply system similar to the second gas supply system in the above-described embodiments is connected to the gas supply port 432b. A third gas supply system similar to the third gas supply system in the above-described embodiments is connected to the gas supply port 432c. An exhaust port 431 configured to exhaust the interior of the process chamber 401 is installed at the process container 403. An exhaust system similar to the exhaust system in the above-described embodiments is connected to the exhaust port 431.

Even when these substrate processing apparatuses are used, a film may be formed under the same sequences and process conditions as those in the above-described embodiments.

A process recipe (a program in which processing procedures, process conditions, and the like are written) used when forming these various types of thin films may be provided individually (in plural) according to substrate processing contents (film type, composition ratio, film quality, film thickness, processing procedures, process conditions, and the like of a thin film to be formed). Then, when starting the substrate processing, an appropriate process recipe may be appropriately selected from a plurality of process recipes according to the contents of the substrate processing. Specifically, the plurality of process recipes individually provided according to the contents of the substrate processing may be stored (installed) in advance in the memory 121c included in the substrate processing apparatus via a telecommunication line or a recording medium (the external memory 123) where the process recipes are recorded. Then, when starting the substrate processing, the CPU 121a included in the substrate processing apparatus appropriately may select an appropriate process recipe from the plurality of process recipes stored in the memory 121c according to the contents of the substrate processing. With this configuration, it is possible to form thin films of various film types, composition ratios, film qualities, and film thicknesses with a single substrate processing apparatus in a versatile and well-reproducible manner. Further, it is possible to reduce an operator's operation burden (input burden of processing procedures, process conditions, and the like) and to quickly start the substrate processing while avoiding an operation error.

Further, the present disclosure may also be realized by, for example, changing a process recipe of the existing substrate processing apparatus. When changing the process recipe, the process recipe according to the present disclosure may be installed on the existing substrate processing apparatus via a telecommunications line or a recording medium where the process recipe is recorded, or it is also possible to change a process recipe of the existing substrate processing apparatus to the process recipe according to the present disclosure by operating an input/output device of the existing substrate processing apparatus.

Further, the present disclosure may be applied to, for example, a word line portion of a NAND flash memory, DRAM or the like of a three-dimensional structure.

Although various typical embodiments of the present disclosure are described above, the present disclosure is not limited to those embodiments, and such embodiments may be used in proper combination.

Hereinafter, Examples will be described.

Example 1

Sample 1 and Sample 3, each of which is a bare wafer (Si substrate), and Sample 2 and Sample 4, each of which is a wafer including a $SiO_2$ film formed on the surface of the wafer, are provided, and film-forming processes shown below are performed on Samples 1 to 4, respectively.

Figure 4:
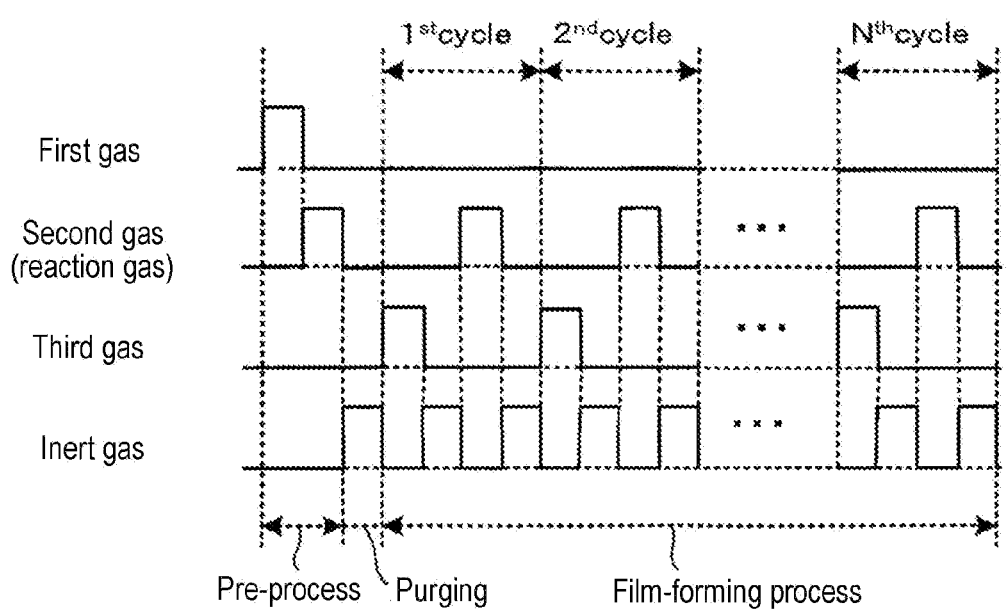
FIG. 4 is a diagram showing a substrate processing sequence according to embodiments of the present disclosure.

Sample 1 is obtained by using the above-described substrate processing apparatus 10 to perform a film-forming process a predetermined number of times after the pre-process according to the above-described substrate processing sequence of FIG. 4 to form a TiN film on the bare wafer. That is, after first gas supply and second gas supply are performed on the bare wafer, the film-forming process is performed a plurality of times. Process conditions are set to predetermined conditions within the process condition range described in the above-described embodiments.

Sample 2 is obtained by using the above-described substrate processing apparatus 10 to perform a film-forming process a predetermined number of times after the pre-process according to the above-described substrate processing sequence of FIG. 4 to form a TiN film on the wafer on which the $SiO_2$ film is formed. That is, after first gas supply and second gas supply are performed on the wafer on which the $SiO_2$ film is formed, the film-forming process is performed a plurality of times. Process conditions are set to predetermined conditions within the process condition range described in the above-described embodiments and are the same as the process conditions in Sample 1.

Sample 3 is obtained by using the above-described substrate processing apparatus 10 to perform a film-forming process a predetermined number of times after the pre-process according to the above-described substrate processing sequence of FIG. 9 to form a TiN film on the bare wafer. That is, after second gas supply and first gas supply are performed on the bare wafer, the film-forming process are performed a plurality of times. Process conditions are set to predetermined conditions within the process condition range described in the above-described embodiments.

Sample 4 is obtained by using the above-described substrate processing apparatus 10 to alternately perform a film-forming process a predetermined number of times after the pre-process according to the above-described substrate processing sequence of FIG. 9 to form a TiN film on the wafer on which the $SiO_2$ film is formed. That is, after second gas supply and first gas supply are performed on the wafer on which the $SiO_2$ film is formed, the film-forming process is performed a plurality of times. Process conditions are set to predetermined conditions within the process condition range described in the above-described embodiments and are the same as the process conditions in Sample 3.

Figure 13A:
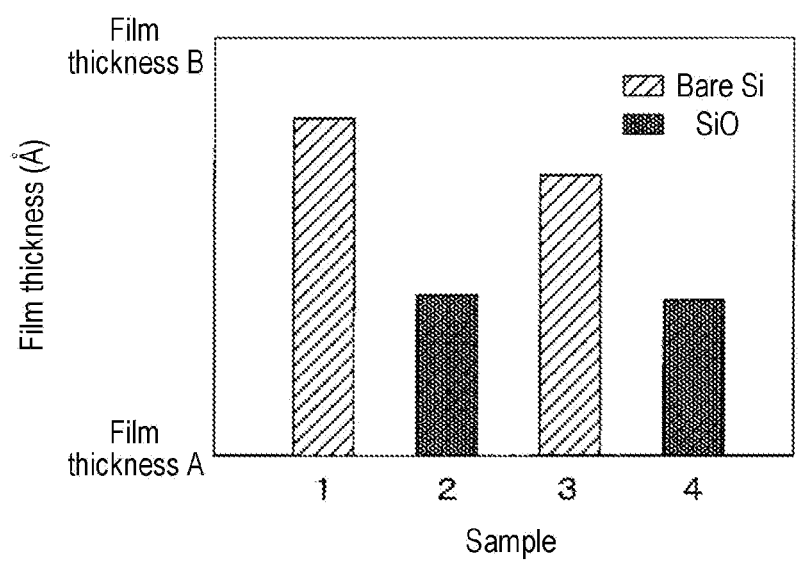
FIG. 13A is a diagram showing comparison in film thickness between a TiN film formed on a bare substrate and a TiN formed on a substrate on which an oxide film is formed, according to the substrate processing sequence shown in FIG. 4 and the substrate processing sequence shown in FIG. 9.

FIG. 13A is a diagram showing a comparison among film thicknesses of the TiN films formed on Samples 1 to 4. Here, the film thickness of the TiN film is converted into an amount of Ti detected. That is, it is shown that as the amount of Ti detected increases, the film thickness of the TiN film increases, and as the film thickness of the TiN film increases, the film is more continuous.

As shown in FIG. 13A, it is confirmed that the TiN film formed on the wafer on which the $SiO_2$ film is formed is smaller in a film thickness and is less likely to form a continuous film than the TiN film formed on the bare wafer. Further, as shown in FIG. 13A, it is confirmed that the film thickness of the TiN film formed on the bare wafer is thicker and a more continuous film is formed in the case where the first gas of Sample 1 is first supplied than the case where the second gas of Sample 3 is first supplied.

Example 2

Sample 1 and Sample 3, each of which is a bare wafer, and Sample 2 and Sample 4, each of which is a wafer including a $SiO_2$ film formed on the surface of the wafer, are provided, and film-forming processes shown below are performed on Samples 1 to 4, respectively.

Sample 1 and Sample 2 are obtained by using the above-described substrate processing apparatus 10 to perform a film-forming process a predetermined number of times after the pre-process according to the above-described substrate processing sequence of FIG. 4 to form a TiN film on the bare wafer and a TiN film on the wafer including the $SiO_2$ film formed on the surface of the wafer, respectively.

Sample 3 and Sample 4 are obtained by using the above-described substrate processing apparatus 10 to perform the above-described film-forming process without performing the pre-process according to the above-described substrate processing sequence of FIG. 4 to form a TiN film on the bare wafer and a TiN film on the wafer including the $SiO_2$ film formed on the surface of the wafer, respectively.

Figure 13B:
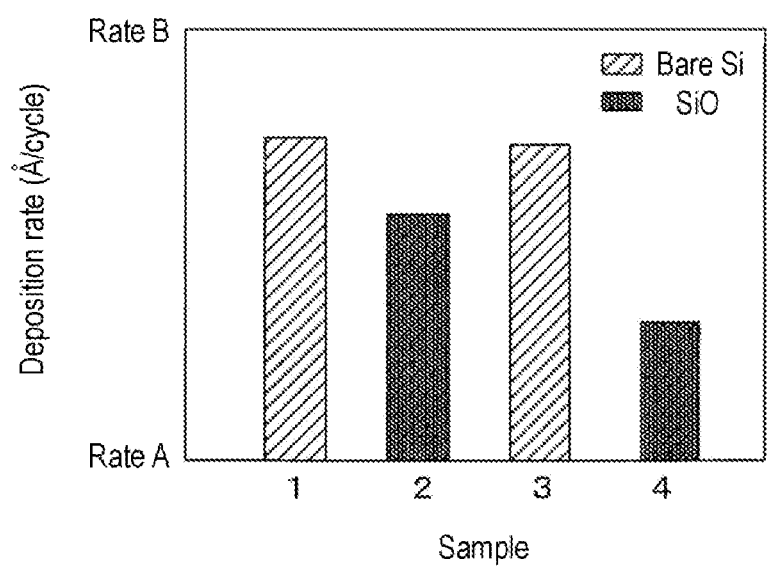
FIG. 13B is a diagram showing comparison in deposition rate between a TiN film formed on a bare substrate and a TiN film formed on a substrate on which an oxide film is formed, according to the substrate processing sequence shown in FIG. 4, and comparison in deposition rate between a TiN film formed on a bare substrate and a TiN film formed on a substrate on which an oxide film is formed, when a film-forming process is performed without performing a pre-process.

FIG. 13B is a diagram showing comparison among deposition rates of Ti formed on the wafers of Samples 1 to 4.

As shown in Samples 1 to 4 of FIG. 13B, it is confirmed that Ti formed on the wafer including the $SiO_2$ film formed on the surface of the wafer is lower in a deposition rate and is less likely to form a continuous film than Ti formed on the bare wafer. Further, as shown in Samples 2 and 4 of FIG. 13B, it is confirmed that, even on the wafer including the $SiO_2$ film formed on the surface of the wafer, by performing the pre-process before the film-forming process, the deposition rate of Ti is higher and a continuous film is easily formed. That is, it is confirmed that the deposition rate is higher and a continuous film is formed by performing the film-forming process after performing the pre-process on the wafer on which an oxide film is formed.

Example 3

Sample 1 and Sample 3, each of which is a bare wafer, and Sample 2 and Sample 4, each of which is a wafer including a $SiO_2$ film formed on the surface of the wafer, are provided, and film-forming processes shown below are performed on Samples 1 to 4, respectively.

Sample 1 and Sample 2 are obtained by using the above-described substrate processing apparatus 10 to perform a film-forming process a predetermined number of times after the pre-process according to the above-described substrate processing sequence of FIG. 4 to form a TiN film on the bare wafer and a TiN film on the wafer on which the $SiO_2$ film is formed, respectively. That is, after first gas supply and second gas supply, the film-forming process is performed a predetermined number of times.

Sample 3 and Sample 4 are obtained by using the above-described substrate processing apparatus 10 to perform a film-forming process a predetermined number of times after performing the pre-process a predetermined number of times according to the above-described substrate processing sequence of FIG. 6 to form a TiN film on the bare wafer and a TiN film on the wafer on which the $SiO_2$ film is formed, respectively. That is, after the first gas supply and the second gas supply are performed a predetermined number of times, the film-forming process is performed a predetermined number of times.

Figure 14A:
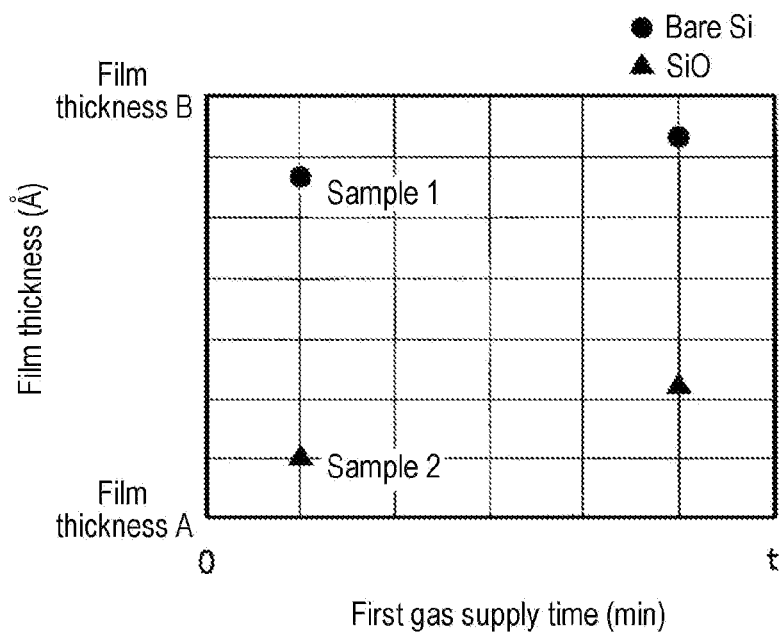
FIG. 14A is a diagram showing a relationship between a first gas supply time and a film thickness of a TiN film formed on each of a bare substrate and a substrate on which an oxide film is formed, according to the substrate processing sequence shown in FIG. 4.
Figure 14B:
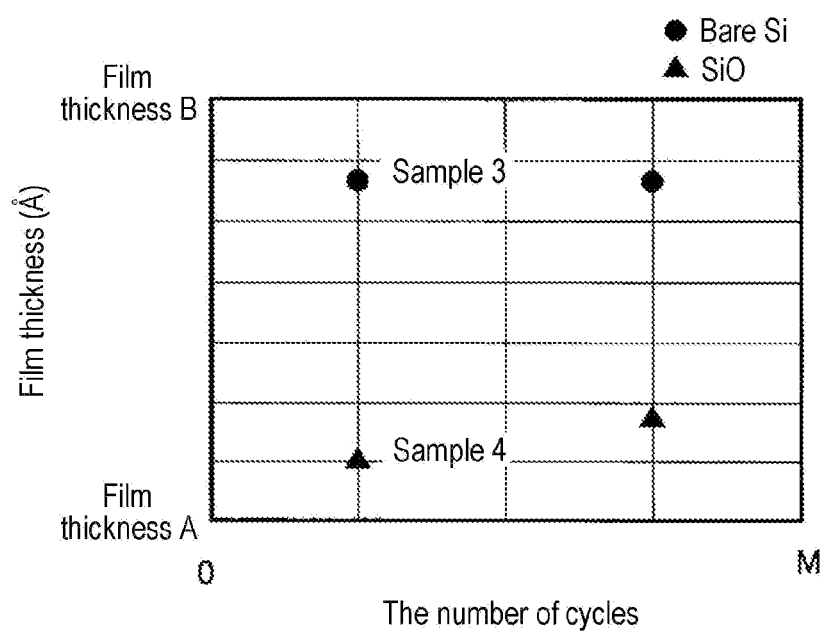
FIG. 14B is a diagram showing a relationship between the number of cycles in a pre-process and a film thickness of a TiN film formed on each of a bare substrate and a substrate on which an oxide film is formed, according to the substrate processing sequence shown in FIG. 6.

FIG. 14A is a diagram showing a relationship between the supply time of the first gas and the film thickness of the TiN film, and FIG. 14B is a diagram showing a relationship between the number of cycles and the film thickness of the TiN film.

As shown in FIG. 14A, it is confirmed that by lengthening the supply time of the first gas in the pre-process, it is possible to form the TiN film with its film thickness slightly increased on the bare wafer and on the wafer including the $SiO_2$ film formed on the surface of the wafer, respectively, to form a thin continuous film, thereby improving the coverage. Further, as shown in FIG. 14B, it is confirmed that by increasing the number of cycles including the first gas supply and the second gas supply in the pre-process, it is possible to form the TiN film with its film thickness slightly increased on the bare wafer and on the wafer including the $SiO_2$ film formed on the surface of the wafer, respectively, to form a thin continuous film, thereby improving the coverage.

That is, it is confirmed that by lengthening the supply time of the first gas in the pre-process or increasing the number of cycles including the first gas supply and the second gas supply in the pre-process, it is possible to promote the adsorption of $TiCl_4$ on the wafer 200 to form a continuous TiN film. That is, it is confirmed that it is possible to improve the coverage of the TiN film, thereby reducing a resistance of a metal-containing film formed on the surface of the TiN film.

According to the present disclosure in some embodiments, it is possible to improve a coverage.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
    (a) supplying a first gas containing hydrogen and oxygen to the substrate;
    (b) supplying a second gas containing nitrogen and hydrogen to the substrate;
    (c) supplying a third gas containing a halogen element to the substrate;
    (d) supplying a reaction gas to the substrate, wherein the reaction gas contains at least one selected from the group of $NH_3$; a mixture of $N_2$ and $H_2$; $N_2H_2$; $N_3H_3$; and $N_2H_4$;
    (e) performing (a) and (b), non-simultaneously and alternately, for a plurality of times; and
    (f) forming a nitride film on the substrate by performing (c) and (d) after performing (e).

2. The method of claim 1, wherein in (e), (b) is performed after (a) is performed.

3. The method of claim 1, wherein (a) is performed in an atmosphere where the first gas is physically adsorbed on the substrate.

4. The method of claim 2, wherein (a) is performed in an atmosphere where the first gas is physically adsorbed on the substrate.

5. The method of claim 1, wherein (b) is performed in an atmosphere where the second gas reacts with the first gas adsorbed on the substrate.

6. The method of claim 1, wherein in (e), (a) is performed after (b) is performed.

7. The method of claim 6, wherein (a) is performed in an atmosphere where the first gas is physically adsorbed on the substrate.

8. The method of claim 1, wherein in (a), the first gas is supplied to the substrate on which an oxide film is formed.

9. The method of claim 8, wherein the oxide film contains at least one or more selected from the group of Si, Al, Ge, Ga, Zr, Ti, and Hf.

10. The method of claim 1, wherein the first gas contains at least one selected from the group of: a mixture of $H_2$ and $O_2$; $H_2O$; and $H_2O_2$.

11. The method of claim 1, wherein the second gas contains at least one selected from the group of: $NH_3$; a mixture of $N_2$ and $H_2$; $N_2H_2$; $N_3H_3$; $N_2H_4$; and other gases containing an amine group.

12. The method of claim 1, wherein the third gas contains Cl or F as the halogen element, and contains at least one or more selected from the group of a Group IV element and a Group VI element, wherein the Group IV element includes Ti, Zr, or Hf and the Group VI element includes Mo or W.

13. A method of manufacturing a semiconductor device, comprising performing the method of claim 1,
    wherein the semiconductor device includes the nitride film.

14. The method of claim 1, wherein in (b), the second gas is supplied to the substrate to terminate a surface of the substrate with an OH group.

15. A non-transitory computer-readable recording medium storing a program that causes, by a computer, a substrate processing apparatus to perform a process in the substrate processing apparatus, the process comprising:
    (a) supplying a first gas containing hydrogen and oxygen to a substrate;
    (b) supplying a second gas containing nitrogen and hydrogen to the substrate;
    (c) supplying a third gas containing a halogen element to the substrate;
    (d) supplying a reaction gas to the substrate, wherein the reaction gas contains at least one selected from the group of $NH_3$; a mixture of $N_2$ and $H_2$; $N_2H_2$; $N_3H_3$; and $N_2H_4$;
    (e) performing (a) and (b), non-simultaneously and alternately, for a plurality of times; and
    (f) forming a nitride film on the substrate by performing (c) and (d) after performing (e).

16. A substrate processing apparatus comprising:
    a gas supply system configured to supply a first gas containing hydrogen and oxygen, a second gas containing nitrogen and hydrogen, a third gas containing a halogen element, and a reaction gas to a substrate, wherein the reaction gas contains at least one selected from the group of $NH_3$; a mixture of $N_2$ and $H_2$; $N_2H_2$; $N_3H_3$; and $N_2H_4$; and
    a controller configured to be capable of controlling the gas supply system to perform a process including:
        (a) supplying the first gas containing hydrogen and oxygen to the substrate;
        (b) supplying the second gas containing nitrogen and hydrogen to the substrate;
        (c) supplying the third gas containing the halogen element to the substrate;
        (d) supplying the reaction gas to the substrate;
        (e) performing (a) and (b), non-simultaneously and alternately, for a plurality of times; and
        (f) forming a nitride film on the substrate by performing (c) and (d) after performing (e).

* * * * *